(12) United States Patent
Chang et al.

(10) Patent No.: US 11,267,693 B2
(45) Date of Patent: Mar. 8, 2022

(54) MANUFACTURING METHOD OF SEMICONDUCTOR STRUCTURE

(71) Applicant: TAIWAN SEMICONDUCTOR MANUFACTURING COMPANY LTD., Hsinchu (TW)

(72) Inventors: Yi-Hsien Chang, Changhua County (TW); Chun-Ren Cheng, Hsin-Chu (TW); Wei-Cheng Shen, Tainan (TW); Wen-Chien Chen, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/943,910

(22) Filed: Jul. 30, 2020

(65) Prior Publication Data

US 2020/0361763 A1    Nov. 19, 2020

Related U.S. Application Data

(62) Division of application No. 14/815,220, filed on Jul. 31, 2015, now Pat. No. 10,737,931.

(51) Int. Cl.
*B81B 3/00* (2006.01)
*B81C 1/00* (2006.01)

(52) U.S. Cl.
CPC .......... *B81B 3/0072* (2013.01); *B81B 3/0013* (2013.01); *B81C 1/00476* (2013.01); *B81C 1/00666* (2013.01); *B81C 1/00968* (2013.01); *B81C 1/00984* (2013.01); *B81B 2201/0257* (2013.01); *B81B 2207/012* (2013.01); *B81C 2201/0105* (2013.01);
(Continued)

(58) Field of Classification Search
CPC ................ B81B 3/0072; B81B 3/0013; B81B 2201/0257; B81B 2207/012; B81B 7/007; B81C 1/00476; B81C 1/00666; B81C 1/00968; B81C 1/00984; B81C 2201/0105; B81C 2201/0109; B81C 2201/0163; B81C 2201/017; B81C 2201/053; B81C 2203/0792; B81C 1/00301; H04R 2201/003
See application file for complete search history.

(56) References Cited

U.S. PATENT DOCUMENTS 7,620,192 B2 * 11/2009 Yamaoka .................. H01G 5/16
                                                              381/175
9,332,354 B2 *  5/2016 Conti ...................... H04R 19/04
(Continued)

*Primary Examiner* — Yasser A Abdelaziez
(74) *Attorney, Agent, or Firm* — WPAT, P.C., Intellectual Property Attorneys; Anthony King

(57) ABSTRACT

A method of manufacturing a semiconductor structure includes providing a first substrate, disposing and patterning a plate over the first substrate, disposing a first sacrificial oxide layer over the plate, forming a plurality of recesses over a surface of the first sacrificial oxide layer, disposing and patterning a membrane over the first sacrificial oxide layer, disposing a second sacrificial oxide layer to surround the membrane and cover the first sacrificial oxide layer; and forming a plurality of conductive plugs passing through the plate or the membrane, wherein the plate includes a semiconductive member and a tensile member, and the semiconductive member is disposed within the tensile member.

20 Claims, 27 Drawing Sheets

(52) U.S. Cl.
CPC .......................... *B81C 2201/017* (2013.01); *B81C 2201/0109* (2013.01); *B81C 2201/0163* (2013.01); *B81C 2201/053* (2013.01); *B81C 2203/0792* (2013.01); *H04R 2201/003* (2013.01)

(56) References Cited

U.S. PATENT DOCUMENTS

| | | | |
|---|---|---|---|
| 2011/0215672 A1* | 9/2011 | Yamaoka | B81B 3/0072 |
| | | | 310/300 |
| 2015/0061048 A1* | 3/2015 | Escher-Poeppel | H04R 19/005 |
| | | | 257/416 |
| 2016/0112807 A1* | 4/2016 | Yuan | B81C 1/00571 |
| | | | 381/174 |

\* cited by examiner

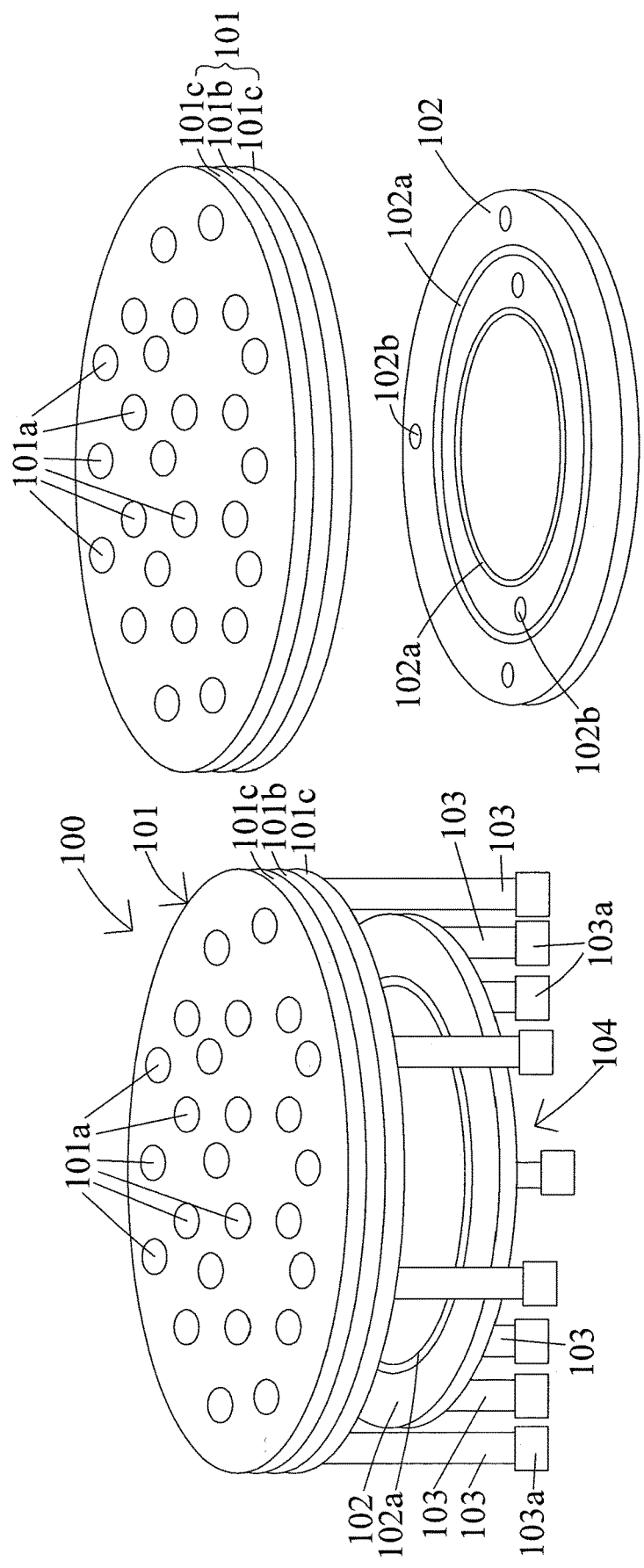

MANUFACTURING METHOD OF SEMICONDUCTOR STRUCTURE

PRIORITY CLAIM AND CROSS-REFERENCE

This patent is a divisional application of U.S. patent application Ser. No. 14/815,220 filed on Jul. 31, 2015, entitled of "SEMICONDUCTOR STRUCTURE AND MANUFACTURING METHOD THREOF", which is incorporated by reference in its entirety.

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. MEMS devices are widely used in various applications. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. The devices involve many complicated steps and increases complexity of manufacturing. The increase in complexity of manufacturing may cause deficiencies such as high yield loss, warpage, low signal to noise ratio (SNR), etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a schematic view of a semiconductor structure in accordance with some embodiments of the present disclosure.

FIG. 2 is an exploded view of a semiconductor structure in accordance with some embodiments of the present disclosure.

DETAILED DESCRIPTION OF THE DISCLOSURE

Figure 3A:
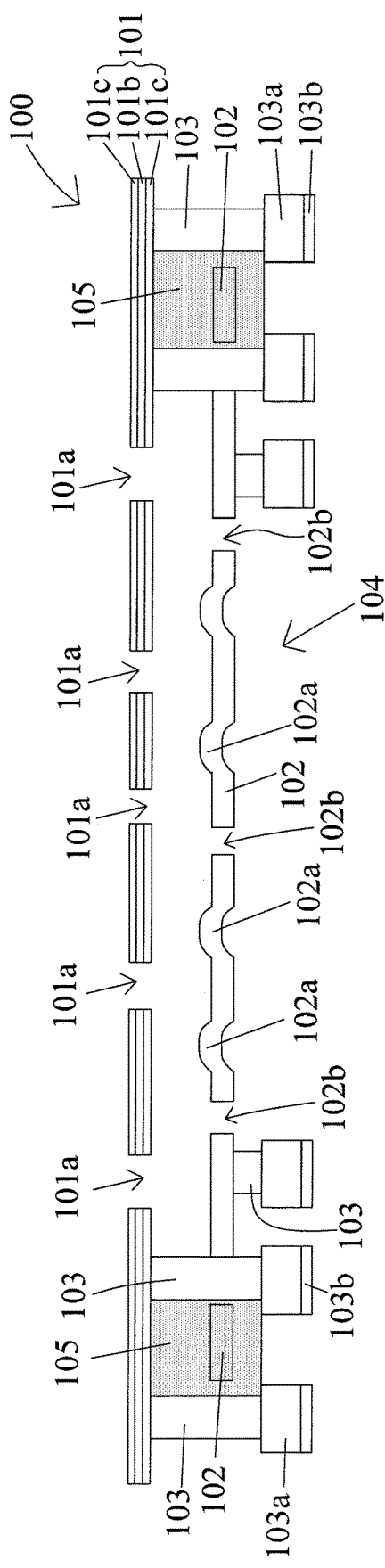
FIG. 3A is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microphone is an electronic equipment. The microphone is an acoustic sensor that converts variation of air pressure such as acoustic pressure or sound wave into electrical signals. The microphone can involve a MEMS device. The MEMS device includes a stationary plate allowing the acoustic pressure passing through and a movable membrane disposed above the plate and responding to the acoustic pressure. The movement or oscillation of the membrane creates a change in an amount of capacitance between the membrane and the plate. The amount of change would then be translated into an electrical signal accordingly. Since the plate and the membrane have small thickness, there is a surface tension or so called "stiction" between the plate and the membrane. The membrane would be easily stuck with the plate by the stiction, which would induce noise or total harmonic distortion, decrease the SNR or even cause failure of the membrane, and therefore lower sensitivity of the membrane. A performance of the microphone would be affected.

Furthermore, upon manufacturing of the MEMS device, the membrane is initially suspended in a sacrificial oxide layer and then is released to become movable relative to the plate by partial removal of the sacrificial oxide layer. A tensile stress on the membrane would be developed by the sacrificial oxide layer during the manufacturing. Such residual tensile stress would cause undesired deflection of the membrane and thus decrease the sensitivity of the membrane.

In addition, the microphone can also involve an active device such as complementary metal oxide semiconductor (CMOS) device. The active device can integrate with the MEMS device by suitable operations such as wire bonding. However, the integration would induce parasitical capacitance and result in a high noise, a low SNR and poor performance of the microphone.

In the present disclosure, a microphone with an improved semiconductor structure is disclosed. The semiconductor structure includes a MEMS device. The MEMS device includes a plate and a membrane. The plate is stationary while the membrane is movable relative to the plate in response to an acoustic pressure such as a sound wave striking on the membrane. The plate of the MEMS device includes semiconductive member and a tensile member. The semiconductive member is sandwiched by the tensile member so as to have sufficient rigidity for resisting residual stress developed during manufacturing and the acoustic pressure striking thereon. Thus, the plate would not have undesired bending and a straightness of the plate can be maintained during manufacturing or during use. Thus, a noise is reduced, the SNR is increased. The performance of the microphone is improved.

Furthermore, the plate and the membrane are supported by a handle substrate (such as silicon substrate) during formation of the plate and the membrane. A thickness of the handle substrate is much greater than a thickness of the plate and the membrane. The handle substrate would be thinned down and partially removed after formation of the plate and the membrane and bonding with another substrate such as CMOS substrate. As a result, an overall thickness of the device is reduced. A form factor of the microphone is also reduced.

Figure 3B:
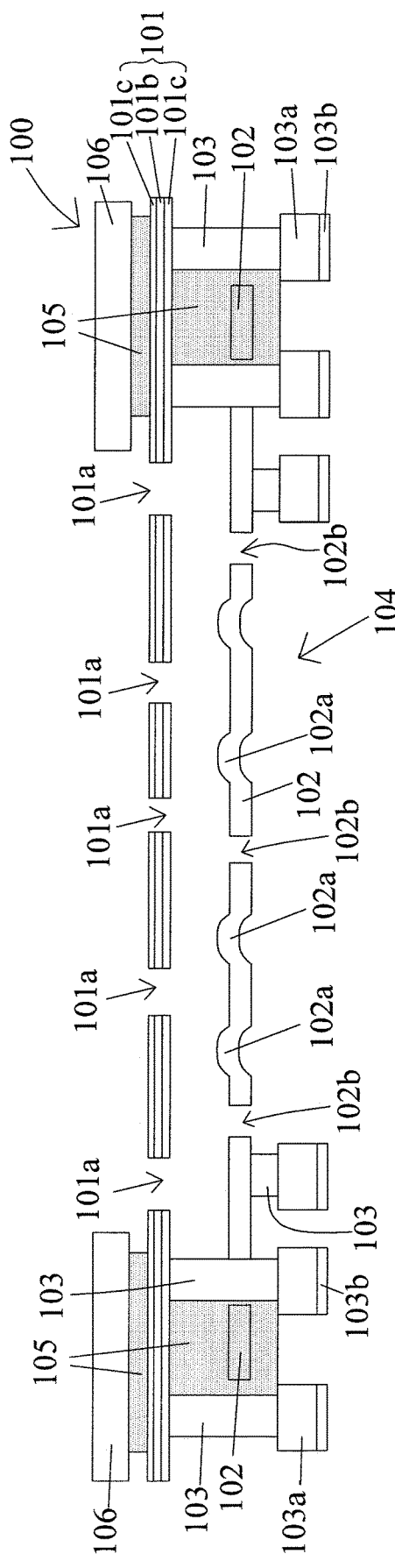
FIG. 3B is a cross-sectional view of a semiconductor structure in accordance with some embodiments of the present disclosure.

FIG. 1 is a schematic perspective view of a semiconductor structure 100 in accordance with some embodiments of the present disclosure. The semiconductor structure 100 includes a plate 101, a membrane 102 and a conductive plug 103. FIG. 2 is an exploded view of the semiconductor structure 100, which illustrates the plate 101 and the membrane 102. FIG. 3A is a schematic cross sectional view of one embodiment of the semiconductor structure 100, and FIG. 3B is a schematic cross sectional view of another embodiment of the semiconductor structure 100.

In some embodiments, the semiconductor structure 100 is configured to sense an acoustic pressure such as sound wave. In some embodiments, the semiconductor structure 100 is a part of a microphone. The acoustic pressure is received by the semiconductor structure 100 and then is converted into an electrical signal. In some embodiments, the semiconductor structure 100 is a MEMS device including electromechanical elements. In some embodiments, the semiconductor structure 100 is miniaturized and has a small form factor. In some embodiments, the semiconductor structure 100 has a thickness of about less than 100 µm. In some embodiments, the semiconductor structure 100 has a thickness of less than about 2 µm. In some embodiments, the semiconductor structure 100 is disposed over and bonded with another substrate. In some embodiments, the semiconductor structure 100 includes an anti-stiction coating disposed over the semiconductor structure 100.

In some embodiments, the semiconductor structure 100 includes the plate 101, the membrane 102 and the conductive plug 103. In some embodiments, the plate 101 is a stationary element and served as a back plate of the semiconductor structure 100. The plate 101 is not movable by the acoustic pressure received by the semiconductor structure 100. In some embodiments, the plate 101 is a stiff perforated element which allows the acoustic pressure passing through. In some embodiments, the plate 101 has a thickness of about 1 µm to about 20 µm. In some embodiments, the thickness of the plate 101 is about 0.3 µm to about 20 µm.

In some embodiments, the plate 101 has a small thickness while has sufficient stiffness to resist residual stress developed upon manufacturing and the acoustic pressure striking thereon. In some embodiments, the plate 101 has stiffness such that the plate 101 would not be bent when the acoustic pressure is received by the semiconductor structure 100 and passes through the plate 101. In some embodiments, the plate 101 would not be bent by the stiction caused by the membrane 102 disposed opposite to the plate 101. The straightness of the plate 101 is maintained.

In some embodiments, the plate 101 is doped with suitable dopants to include several doped regions. In some embodiments, the plate 101 is doped with a p-type dopant such as boron or an n-type dopant such as phosphorous. In some embodiments, the plate 101 uses the same type of dopant to prevent p-n junction and have better conductivity.

In some embodiments, the anti-stiction coating is a self-assembled monolayer (SAM) coating which can prevent or reduce stiction between the plate 101 and the membrane 102. In some embodiments, the plate 101 is in circular, rectangular, quadrilateral, triangular, hexagon, or any other suitable shapes.

In some embodiments, the plate 101 includes a semiconductive member 101b and a tensile member 101c. In some embodiments, the semiconductive member 101b is disposed within the tensile member 101c. In some embodiments, the semiconductive member 101b is surrounded or encapsulated by the tensile member 101c.

In some embodiments, the tensile member 101c includes two layers, and the semiconductive member 101b is disposed between two layers of the tensile member 101c. The semiconductive member 101b is surrounded or sandwiched by the two layers of the tensile member 101c to form a stress balance plate. In some embodiments, the plate 101 includes several layers, and at least one layer is semiconductive member 101b and at least two layers are tensile member 101c surrounding or sandwiching the semiconductive member 101b. In some embodiments, the plate 101 includes a first layer, a second layer and a third layer. The first layer is the semiconductive member 101b, and the second and third layers are tensile member 101c surrounding or sandwiching the first layer. In some embodiments, a thickness of the first layer is about 0.1 µm to about 10 µm. In some embodiments, a thickness of the second layer or the third layer is about 0.05 µm to about 5 µm.

In some embodiments, the semiconductive member 101b includes polysilicon (for example, having tensile stress of about 0~50 MPa), silicon or any other suitable semiconductive materials. In some embodiments, the tensile member 101c includes nitride, silicon nitride (for example, having tensile stress of about 50~400 MPa), aluminum (for example, having tensile stress of 20~100 MPa), titanium nitride (for example, having tensile stress of about 10~200 MPa) or any other suitable materials.

In some embodiments, the tensile member 101c is configured to minimize deformation of the plate 101. The plate including the semiconductive member 101b and the tensile member 101c would have sufficient rigidity for resisting residual stress developed during manufacturing and the acoustic pressure striking thereon. Thus, the plate 101 would not have undesired bending and a straightness of the plate can be maintained during manufacturing or during use. The plate 101 is thin while has stiffness to resist the residual stress upon manufacturing and the acoustic pressure striking thereon. The plate 101 has stiffness such that the plate 101 would not be bent when the acoustic pressure is received by the semiconductor structure 100 and passes through the plate 101. In some embodiments, the plate 101 would not be bent by the stiction caused by the membrane 102 disposed opposite to the plate 101. The straightness of the plate 101 is maintained. In some embodiments, the stationary plate 101 could be placed at bottom of membrane 102. In some embodiments, the stationary plate 101 could be placed at both sides (for example, top and bottom) of the membrane 102.

In some embodiments, the plate 101 includes several apertures 101a. Each of the apertures 101a passes through the plate 101. In some embodiments, the apertures 101a are configured for the acoustic pressure received by the semiconductor structure 100 passing through. The apertures 101a can relieve a stress on the plate 101 caused by the acoustic pressure, such that the plate 101 would not be bent by the acoustic pressure. Furthermore, the apertures 101a are configured to prevent the membrane 102 sticking with the plate 101 by the acoustic pressure and the stiction between the plate 101 and the membrane 102.

In some embodiments, the apertures 101a are arranged in a regular or an irregular array over the plate 101. In some embodiments, the apertures 101a are arranged in any suitable patterns. In some embodiments, the aperture 101a is in a circular, quadrilateral, elliptical, triangular, hexagon, or any other suitable shapes. In some embodiments, the aperture 101a has a width of about 0.5 μm to about 5 μm. In some embodiments, a pitch between adjacent apertures 101a is about 1 μm to about 100 μm. In some embodiments, a total number of the apertures 101a, the pitch between adjacent apertures 101a or the width of each aperture 101a is predetermined and designed, so that the plate 101 would not be bent by the acoustic pressure received and the stiction between the plate 101 and the membrane 102, and the straightness of the plate 101 can be maintained.

In some embodiments, the membrane 102 is disposed opposite to the plate 101. In some embodiments, the membrane 102 is disposed under the plate 101. In some embodiments, the membrane 102 is disposed away from the plate 101 in a distance of about 0.5 μm to about 5 μm, or about 0.3 μm to about 5 μm. In some embodiments, the membrane 102 is in circular, rectangular, quadrilateral, triangular, hexagon, or any other suitable shapes. In some embodiments, the membrane 102 includes polysilicon. In some embodiments, the membrane 102 is conductive and capacitive. In some embodiments, the membrane 102 is supplied with a predetermined charge. In some embodiments, the membrane 102 includes an anti-stiction coating disposed over the membrane 102 to prevent or reduce a stiction between the plate 101 and the membrane 102. In some embodiments, the anti-stiction coating is a SAM coating. In some embodiments, the membrane 102 has a thickness of about 0.1 μm to about 5 μm.

In some embodiments, the membrane 102 is a movable or oscillateable element. The membrane is displaceable relative to the plate 101 and is served as a diaphragm. In some embodiments, the membrane 102 is displaceable within a cavity 104 and relative to the plate 101. In some embodiments, the membrane 102 is configured to sense the acoustic pressure received by the semiconductor structure 100. The membrane 102 is sensitive to the acoustic pressure. When the acoustic pressure is impinged on the membrane 102, the membrane 102 would be displaced or oscillated 101 corresponding to the acoustic pressure impinged on the membrane 102. In some embodiments, a magnitude and/or a frequency of the displacement of the membrane 102 corresponds to a volume and/or pitch of the acoustic pressure impinged on the membrane 102.

In some embodiments, the displacement of the membrane 102 relative to the plate 101 would cause a capacitance change between the membrane 102 and the plate 101. The capacitance change would then be translated into an electrical signal by a circuitry connected with the plate 101 and the membrane 102. In some embodiments, the acoustic pressure impinged on the membrane 102 is converted into the electrical signal representing the acoustic pressure impinged on the membrane 102. In some embodiments, the electrical signal generated would be transmitted to another device, another substrate or another circuitry for further processing.

In some embodiments, the membrane 102 includes several corrugations 102a. The corrugations 102a are arranged over the membrane 102. In some embodiments, the corrugations 102a face to and are opposite to the apertures 101a of the plate 101. In some embodiments, the corrugations 102a are substantially aligned or not aligned with the apertures 101a of the plate 101. In some embodiments, the corrugations 102a are protruded or recessed from a surface of the membrane 102. In some embodiments, the corrugation 102a is a groove extending across the surface of the plate 101. In some embodiments, the corrugation 102a is a protruded portion or a recessed portion of the surface of the plate 101. In some embodiments, the corrugation 102a is a bump on the plate 101.

In some embodiments, the corrugations 102a are configured to relieve undesired stress over the membrane 102. In some embodiments, the corrugations 102a prevent the membrane 102 from sticking with the plate 101 caused by stiction between the plate 101 and the membrane 102. In some embodiments, the corrugations 102a prevent undesired deflection of the membrane 102. The corrugations 102a can facilitate the membrane 102 to return to its initial straight configuration after receiving and bending by the acoustic pressure. When the membrane 102 is displaced by the acoustic pressure, the membrane 102 would be bent. After the receipt of the acoustic pressure, it is desirable the membrane 102 would be returned to the initial straight configuration.

In some embodiments, the corrugation 102a is in a closed loop, a quadrilateral ring, an annular shape, an elliptical shape or any other suitable configurations. In some embodiments, the corrugation 102a has a width of about 0.1 μm to about 10 μm. In some embodiments, a pitch between adjacent corrugations 102a is about 1 μm to about 200 μm. In some embodiments, there are a number of corrugations 102a disposed on the membrane 102. For example, there are two annular corrugations 102a as illustrated in FIG. 2.

In some embodiments, the shape, the width, the pitch or the number of the corrugations 102a is predetermined and designed, so that the membrane 102 would not have undesired bending. In some embodiments, the shape, the width or the number of the corrugations 102a is chosen to optimize the straightness and the sensitivity of the membrane 102. The membrane 102 can sense the acoustic pressure accurately and promptly, and can be returned to the initial straight configuration after sensing the acoustic pressure.

In some embodiments, the membrane 102 includes several holes 102b over the membrane 102. In some embodiments, the holes 102b are configured to relieve undesired stress over the membrane 102. In some embodiments, the holes 102b can prevent or minimize the membrane 102 from sticking with the plate 101 by stiction between the plate 101 and the membrane 102. In some embodiments, the holes 102b are substantially aligned or not aligned with the apertures 101a. In some embodiments, a total number of holes 102b is chosen, so that the membrane 102 would not have undesired bending. In some embodiments, a total number of holes 102b are less than a total number of the apertures 101a over the plate 101. In some embodiments, the total number of the holes 102b is chosen to optimize the straightness and the sensitivity of the membrane 102. The membrane 102 can sense the acoustic pressure accurately and promptly, and can be returned to the initial straight configuration after sensing the acoustic pressure. Also, the membrane 102 can be prevented from sticking with the plate 101 by stiction.

In some embodiments, the conductive plug 103 extends from the plate 101. In some embodiments, the conductive plug 103 extends from the plate 101 and is passes through the membrane 102. In some embodiments, the conductive plug 103 supports the plate 101 and/or the membrane 102. In some embodiments, the conductive plug 103 electrically connects the plate 101 and/or the membrane 102 with a circuitry. In some embodiments, the conductive plug 103 includes polysilicon. In some embodiments, the conductive plug 103 has a height from the plate 101 of about 5 μm to about 20 μm. In some embodiments, the conductive plug 103 has a height from the membrane 102 of about 2 μm to about 20 μm. In some embodiments, the conductive plug 103 and the plate 101 define the cavity 104, such that the membrane 102 can be displaced or vibrated within the cavity 104.

In some embodiments, the conductive plug 103 includes a standing off pad 103a disposed over the conductive plug 103. In some embodiments, the standing off pad 103a is a protruded portion of the conductive plug 103 and is configured to facilitate bonding of the conductive plug 103 with another substrate or external circuitry, so that the semiconductor structure 100 bonds with and electrically connects with another substrate or external circuitry. In some embodiments, the standing off pad 103a includes polysilicon. In some embodiments, the standing off pad 103a has a height of about 1 μm to about 20 μm.

In some embodiments, the conductive plug 103 includes a semiconductive material 103b disposed over the conductive plug 103. In some embodiments, the semiconductive material 103b includes germanium, gold, tin, silicon, tin, copper, tin copper alloy (SnCu) or other suitable materials. In some embodiments, the semiconductive material 103b is disposed over the standing off pad 103a. The semiconductive material 103b is configured to facilitate bonding of the conductive plug 103 with a bond pad on another substrate.

In some embodiments as shown in FIG. 3A, the semiconductor structure 100 includes an oxide 105 disposed around the conductive plug 103 and a peripheral portion of the membrane 102. In some embodiments, the oxide 105 surrounds the membrane 102. In some embodiments, the oxide 105 is protected and surrounded by the conductive plug 103, the standing off pad 103a and the plate 101. In some embodiments, the oxide 105 surrounds the periphery of the membrane 102. In some embodiments, the oxide 105 is configured by a protection ring surrounding the periphery of the membrane 105. In some embodiments, the oxide 105 isolates the plate 101, the membrane 102 and the conductive plug 103 from each other. In some embodiments, the oxide 105 provides support to the plate 101 and/or the membrane 102.

In some embodiments as shown in FIG. 3B, the oxide 105 is disposed over a peripheral portion of the plate 101. In some embodiments, the oxide 105 surrounds the plate 101. In some embodiments, the oxide 105 is disposed between the plate 101 and a device substrate 106. In some embodiments, the device substrate 106 is disposed over or adjacent to the peripheral portion of the plate 101. The plate 101 is disposed between the device substrate 106 and the membrane 102. In some embodiments, a thickness of the oxide 105 disposed between the device substrate 106 and the plate 101 is about 1 μm to about 20 μm.

Figure 4A:
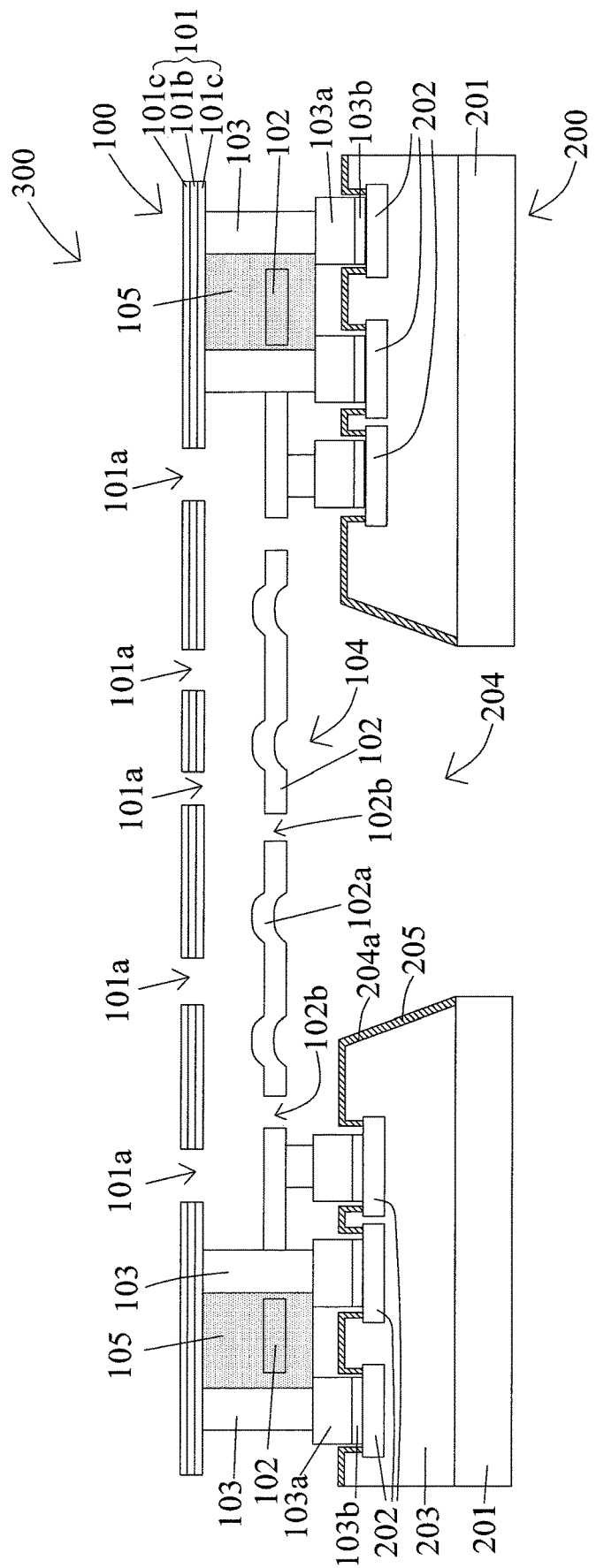
FIG. 4A is a cross-sectional view of a monolithic sensor in accordance with some embodiments of the present disclosure.
Figure 4B:
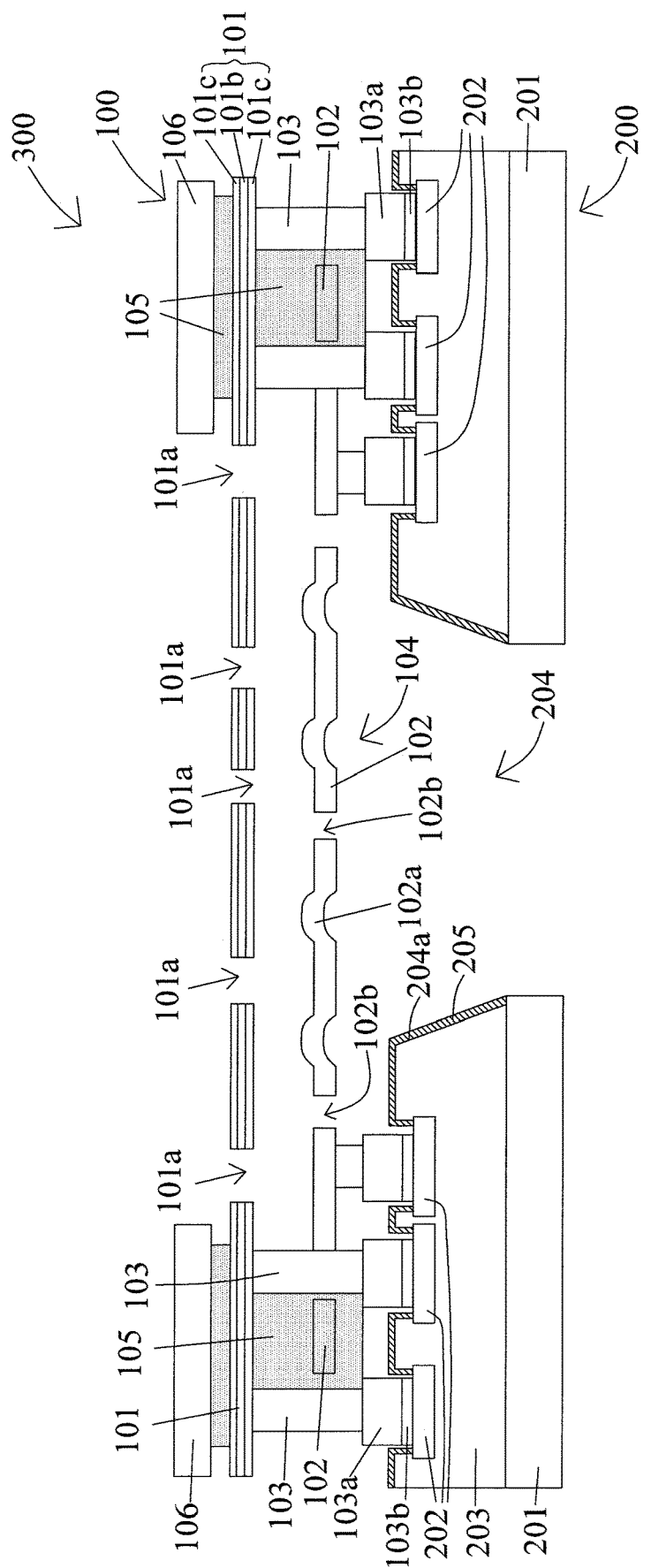
FIG. 4B is a cross-sectional view of a monolithic sensor in accordance with some embodiments of the present disclosure.

FIG. 4A is a cross-sectional view of one embodiment of a monolithic sensor 300 in accordance with some embodiments of the present disclosure. FIG. 4B is a cross-sectional view of another embodiment of a monolithic sensor 300 in accordance with some embodiments of the present disclosure. In some embodiments, the monolithic sensor 300 is configured for sensing an acoustic pressure. In some embodiments, the monolithic sensor 300 includes a device integrated with another device. In some embodiments, the monolithic sensor 300 is included in a microphone.

In some embodiments, the monolithic sensor 300 includes a first device 100 and a second device 200. In some embodiments, the first device 100 is the semiconductor structure 100 as described above. In some embodiments, the first device 100 is a MEMS device. In some embodiments, the first device 100 includes a plate 101, a membrane 102, a conductive plug 103, a first cavity 104 and an oxide 105, which have similar configuration as described above and/or as illustrated in FIGS. 1, 2, 3A and 3B.

In some embodiments, the plate 101 includes a semiconductive member 101b and a tensile member 101c. In some embodiments, the semiconductive member 101b is disposed within the tensile member 101c. In some embodiments, the semiconductive member 101b is configured in the tensile member 101c. In some embodiments, the semiconductive member 101b is surrounded or encapsulated by the tensile member 101c.

In some embodiments, the plate 101 includes a first layer, a second layer and a third layer. In some embodiments, the first layer is disposed between the second layer and the third layer. In some embodiments, the first layer includes semiconductor or semiconductive materials such as polysilicon, silicon, etc. In some embodiments, the second layer and the third layer respectively include nitride or dielectric materials such as silicon nitride, etc. In some embodiments, the first layer is the semiconductive member 101b, and the second layer and the third layer are tensile member 101c surrounding or sandwiching the first layer. In some embodiments, the plate 101 includes several layers, and at least one layer is semiconductive member 101b and at least two layers are tensile member 101c surrounding or sandwiching the semiconductive member 101b.

In some embodiments, the second device 200 is an active device. In some embodiments, the second device is a CMOS device. In some embodiments, the second device 200 includes a substrate 201 and a bond pad 202. In some embodiments, the substrate 201 is a CMOS substrate. In some embodiments, the substrate 201 includes CMOS component and circuitry. In some embodiments, the bond pad 202 is disposed over the substrate 201. In some embodiments, the bond pad 202 is configured to receive an external interconnect structure so that the circuitry of the substrate 201 can electrically connect with another substrate or another device. In some embodiments, the bond pad 202 includes aluminum, copper, tin or gold.

In some embodiments, the second device 200 includes a layer 203 disposed over the substrate 201. In some embodiments, the layer 203 includes CMOS device and inter metal connection (circuitry). In some embodiments, the layer 203 includes passivation such as dielectric material, silicon oxide, silicon nitride, etc. In some embodiments, the layer 203 surrounds the bond pad 202. The bond pad 202 is partially exposed from the layer 203. In some embodiments, the bond pad 202 is recessed from a top surface of the layer 203. In some embodiments, the layer 203 is disposed away from the membrane 102 of the first device 100 in a distance of about 1 μm to about 10 μm, about 0.3 μm to about 10 μm, or about 0.3 μm to about 5 μm.

In some embodiments, the first device 100 is integrated with the second device 200. In some embodiments, the first device 100 is flipped and bonded over the second device 200. The first device 100 having the plate 101 facing upward and the conductive plug 103 facing downward is integrated with the second device 200. In some embodiments, the conductive plug 103 of the first device is bonded with the bond pad 202 of the second device 200 to integrate the first device 100 with the second device 200. In some embodiments, a standing off pad 103a of the first device 100 or a semiconductive material 103b on the standing off pad 103a is disposed over and bonded with the bond pad 202 of the second device 200. In some embodiments, the monolithic sensor 300 has a height of about 200 μm to about 500 μm after the bonding and the integration of the first device 100 and the second device 200.

In some embodiments, the second device 200 includes a protective layer 205 disposed conformal to the top surface of the layer 203 facing the first device 100. In some embodiments the protective layer 205 is configured to protect the layer 203 or other components disposed over the second substrate 106 from being etched away. In some embodiments, the protective layer 205 is configured to prevent the layer 203 or other components disposed over the second substrate 106 from being attacked by hydrofluoric (HF) acid vapor. In some embodiments, the protective layer 205 includes aluminum oxide ($Al_2O_3$). In some embodiments, the bond pad 202 is exposed from the protective layer 205.

In some embodiments, the second device 200 includes a second cavity 204 disposed over the first cavity 104 of the first device 100 and passed through the substrate 201 and the layer 203. In some embodiments, the second cavity 204 is coupled with the first cavity 104. In some embodiments, the second cavity 204 is aligned with the corrugations 102a of the membrane 102 and/or the apertures 101a of the plate 101. In some embodiments, the second cavity 204 has a sidewall 204a covered by the protective layer 205. In some embodiments, the sidewall 204a is a sloped portion of the top surface of the layer 203.

In some embodiments, the second cavity 204 is configured to receive an acoustic pressure. The acoustic pressure can travel and pass through the second cavity 204 so as to impinge on the membrane 102. When the acoustic pressure is impinged on the membrane 102, the membrane 102 would be displaced or oscillated within the first cavity 104. The displacement of the membrane 102 varies a capacitance between the plate 101 and the membrane 102, thereby an electrical signal is generated. In some embodiments, the capacitance change is transmitted to the CMOS device 200 through the conductive plug 103 and the bond pad 202, and then the electrical signal is generated by the CMOS device 200. The displacement of the membrane 102 by the acoustic pressure entering from the second cavity 204 and impinged on the membrane 102 is converted into the electrical signal by the CMOS device 200. In some embodiments, the acoustic pressure can pass through the apertures 101a and the holes 102b to relieve the acoustic pressure after sensing the acoustic pressure.

In the present disclosure, a method of manufacturing a semiconductor structure is also disclosed. In some embodiments, a semiconductor structure is formed by a method 500. The method 500 includes a number of operations and the description and illustration are not deemed as a limitation as the sequence of the operations.

Figure 5:
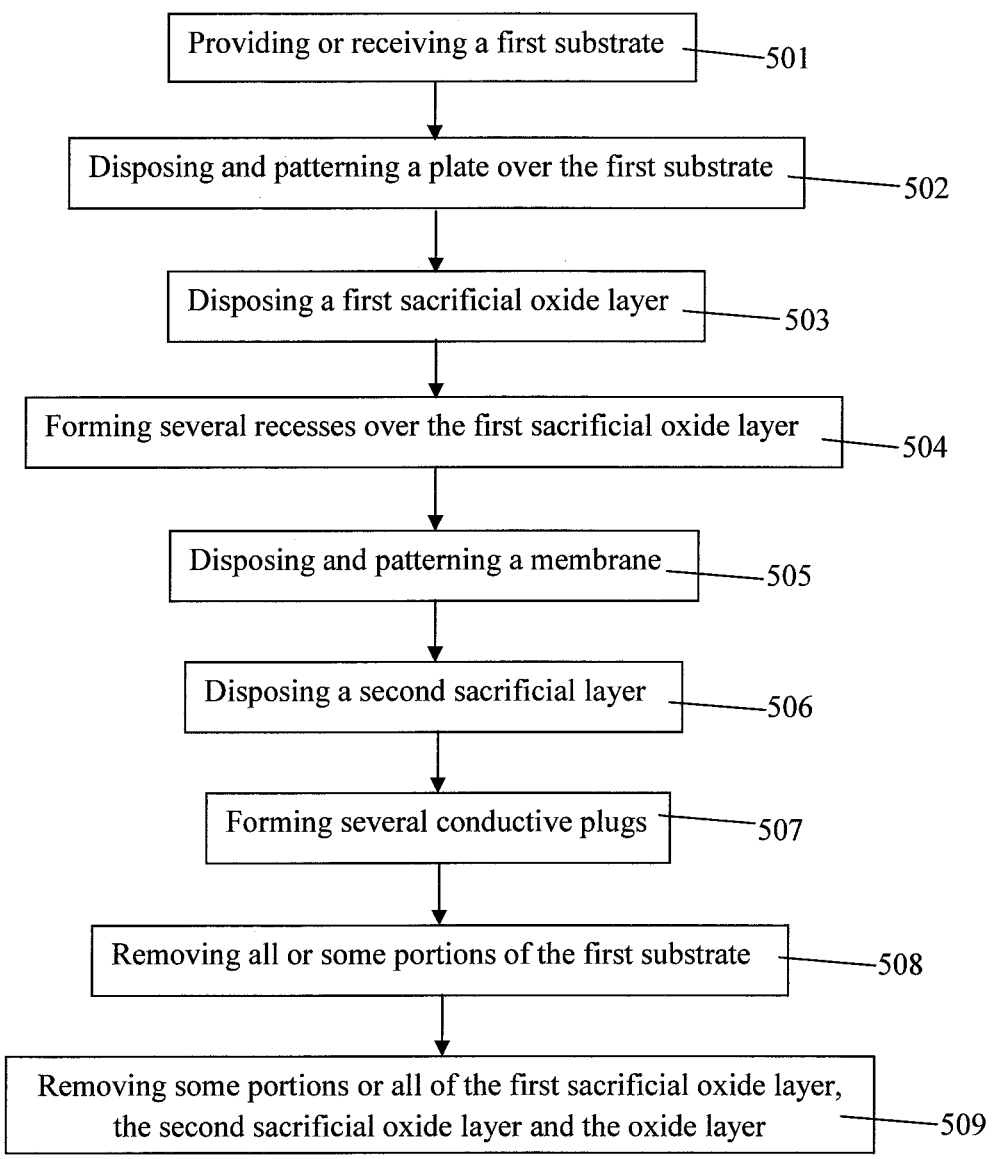
FIG. 5 is a flow diagram of a method of manufacturing a semiconductor structure in accordance with some embodiments of the present disclosure.

FIG. 5 is an embodiment of a method 500 of manufacturing a semiconductor structure. The method 500 includes a number of operations (501, 502, 503, 504, 505, 506, 507, 508 and 509).

Figure 5A:
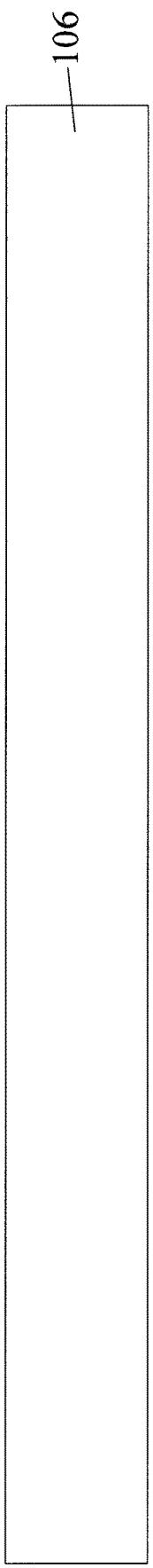
FIG. 5A is a cross-sectional view of a first substrate in accordance with some embodiments of the present disclosure.
Figure 5B:
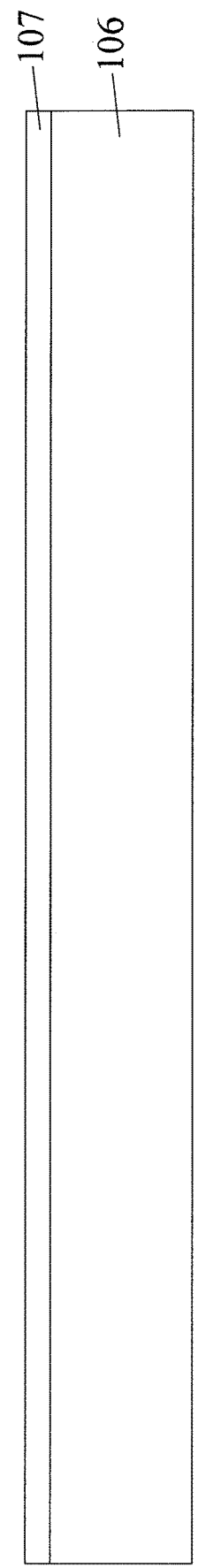
FIG. 5B is a cross-sectional view of a first substrate with an oxide layer in accordance with some embodiments of the present disclosure.

In operation 501, a first substrate 106 is received or provided as shown in FIGS. 5A and 5B. In some embodiments, the first substrate 106 is a handle substrate or a handle wafer. In some embodiments, the first substrate 106 includes silicon. In some embodiments, the first substrate 106 facilitates a formation of a MEMS device thereon. In some embodiments, the first substrate 106 is a silicon substrate. In some embodiments, the first substrate has a thickness of about 400 μm to about 1000 μm.

In some embodiments as shown in FIG. 5B, an oxide layer 107 is disposed over the first substrate 106. In some embodiments, the oxide layer 107 includes silicon oxide or any other suitable materials. In some embodiments, a thickness of the oxide layer 107 is about 1 μm to about 5 μm.

Figure 5C:
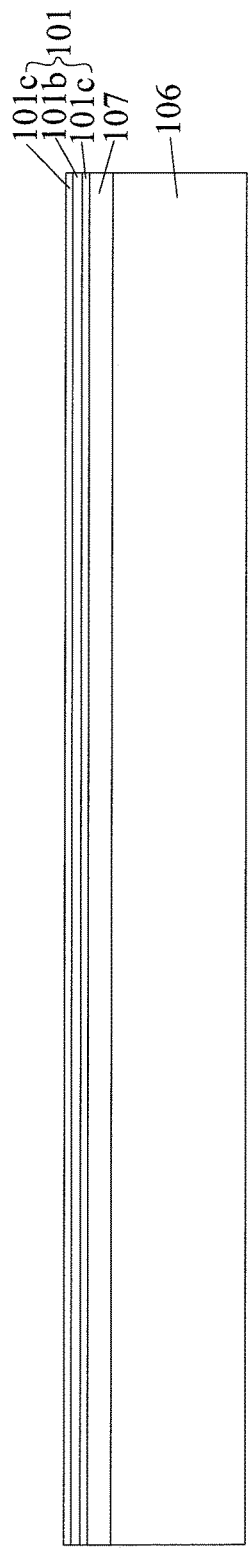
FIG. 5C is a cross-sectional view of a plate in accordance with some embodiments of the present disclosure.
Figure 5D:
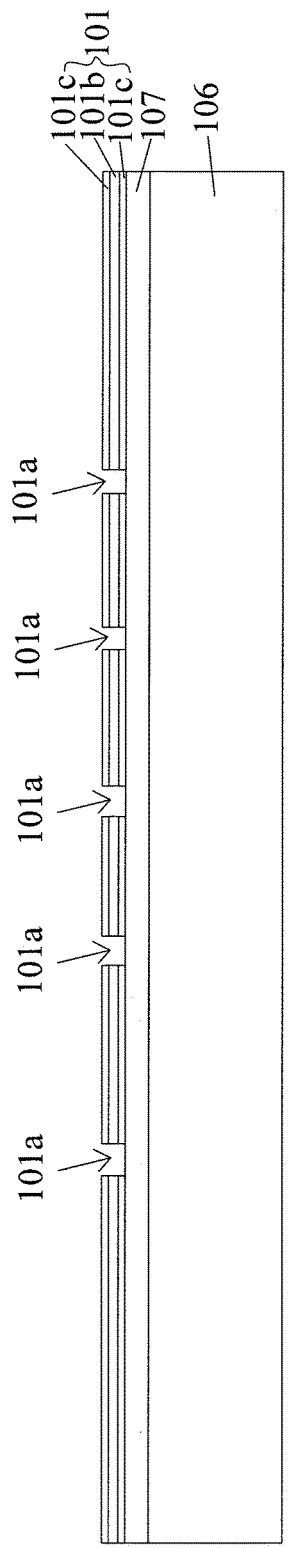
FIG. 5D is a cross-sectional view of a patterned plate in accordance with some embodiments of the present disclosure.

In operation 502, a plate 101 is disposed over the first substrate 106 and is patterned as shown in FIGS. 5C and 5D. In some embodiments, the plate 101 is disposed over the oxide layer 107. In some embodiments, the plate 101 has a thickness of about 0.3 μm to about 20 μm. In some embodiments, the plate 101 is doped with suitable dopants such as a p-type dopant or an n-type dopant by in-situ doping, implantation or thermal diffusion. In some embodiments, the plate 101 uses the same type of dopant to prevent p-n junction and have better conductivity.

In some embodiments, the plate 101 includes a semiconductive member 101b and a tensile member 101c. In some embodiments, the semiconductive member 101b is surrounded or encapsulated by the tensile member 101c. In some embodiments, the semiconductive member 101b includes polysilicon, silicon or any other suitable semiconductive materials. In some embodiments, the tensile member 101c includes nitride, silicon nitride or any other suitable dielectric materials.

In some embodiments, the tensile member 101c includes two layers, and the semiconductive member 101b is disposed between two layers of the tensile member 101c. The semiconductive member 101b is surrounded or sandwiched by the two layers of the tensile member 101c. In some embodiments, the plate 101 includes several layers, and at least one layer is semiconductive member 101b and at least two layers are tensile member 101c surrounding or sandwiching the semiconductive member 101b. In some embodiments, the plate 101 includes a first layer, a second layer and a third layer. The first layer is the semiconductive member 101b, and the second and third layers are tensile member 101c surrounding or sandwiching the first layer. In some embodiments, the second layer (the tensile member 101c) is disposed over the oxide layer 107 or the first substrate 106, and then the first layer (the semiconductive member 101b) is disposed over the second layer, and then the third layer (the tensile member 101c) is disposed over the first layer.

In some embodiments as shown in FIG. 5D, the plate 101 is patterned. In some embodiments, the plate 101 is patterned to form several apertures 101a over the plate 101. In some embodiments, the apertures 101a pass through the plate 101 to expose some of the oxide layer 107. In some embodiments, some portions of the plate 101 are removed by photolithography and etching operations to form the apertures 101a.

Figure 5E:
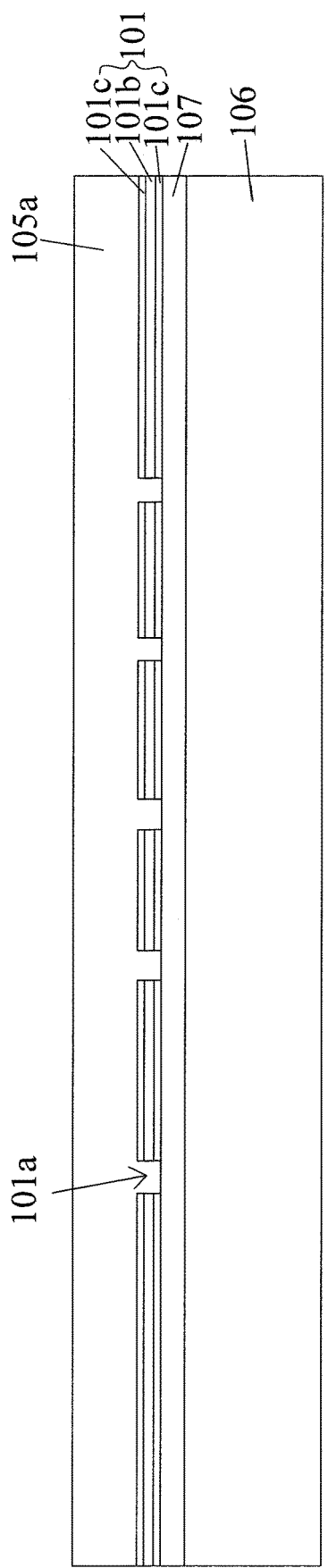
FIG. 5E is a cross-sectional view of a first sacrificial oxide layer disposed over a first substrate in accordance with some embodiments of the present disclosure.

In operation 503, a first sacrificial oxide layer 105a is disposed over the plate 101 as shown in FIG. 5E. In some embodiments, the first sacrificial oxide layer 105a is disposed by any suitable deposition techniques such as chemical vapor deposition (CVD) and the like. In some embodiments, the first sacrificial oxide layer 105a includes dielectric material such as silicon oxide. In some embodiments, the first sacrificial oxide layer 105a has a thickness of about 0.3 µm to about 5 µm.

Figure 5F:
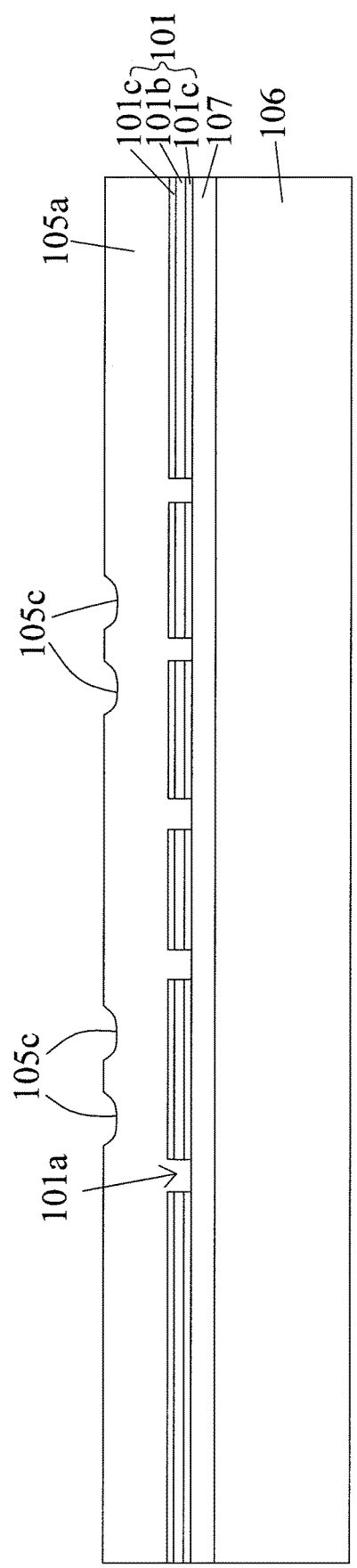
FIG. 5F is a cross-sectional view of several recesses disposed over a first sacrificial oxide layer in accordance with some embodiments of the present disclosure.

In operation 504, several recesses 105c are formed over a surface of the first sacrificial oxide layer 105a as shown in FIG. 5F. In some embodiments, the recesses 105c are indented from the surface of the first sacrificial oxide layer 105a. In some embodiments, some portions of the first sacrificial oxide layer 105a are removed from the surface to form the recesses 105c. In some embodiments, the recesses 105c are formed by photolithography and wet or dry etching operations.

Figure 5G:
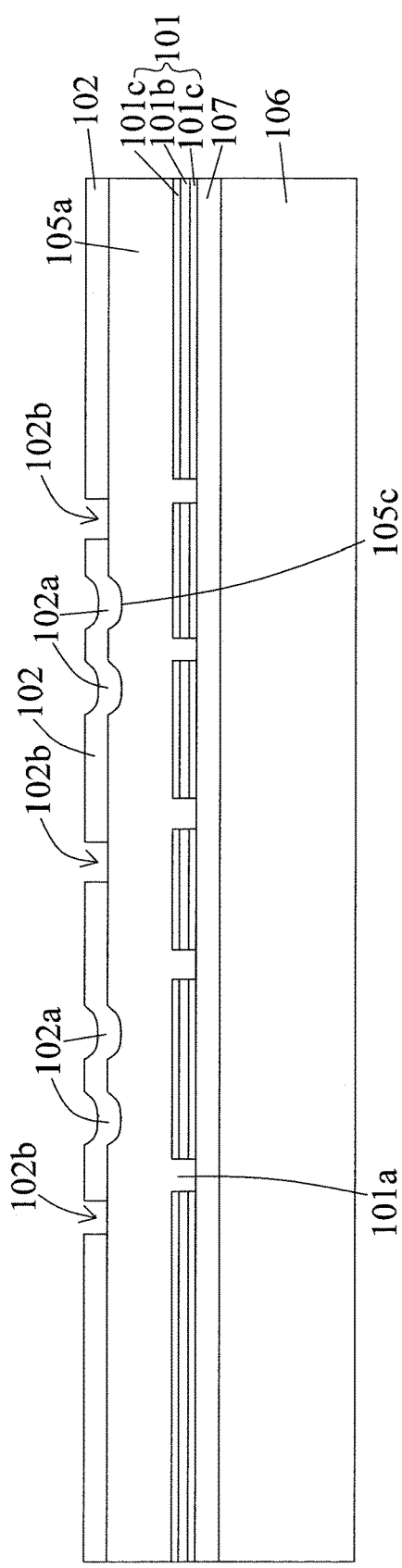
FIG. 5G is a cross-sectional view of a membrane disposed over a first sacrificial oxide layer in accordance with some embodiments of the present disclosure.

In operation 505, a membrane 102 is disposed and then patterned over the first sacrificial oxide layer 105a as shown in FIG. 5G. In some embodiments, the membrane 102 is disposed over the first sacrificial oxide layer 105a by any suitable deposition operations. In some embodiments, the membrane 102 includes polysilicon. In some embodiments, the membrane 102 is doped with any suitable dopants. In some embodiments, the membrane 102 has a thickness of about 0.1 µm to about 5 µm.

In some embodiments, the membrane 102 is patterned by photolithography and etching operations after the deposition operations, so that several corrugations 102a and several holes 102b are formed over the membrane 102. In some embodiments, some portions of the membrane 102 are removed to form the holes 102b. The holes 102b expose a portion of the first sacrificial oxide layer 105a.

Figure 5H:
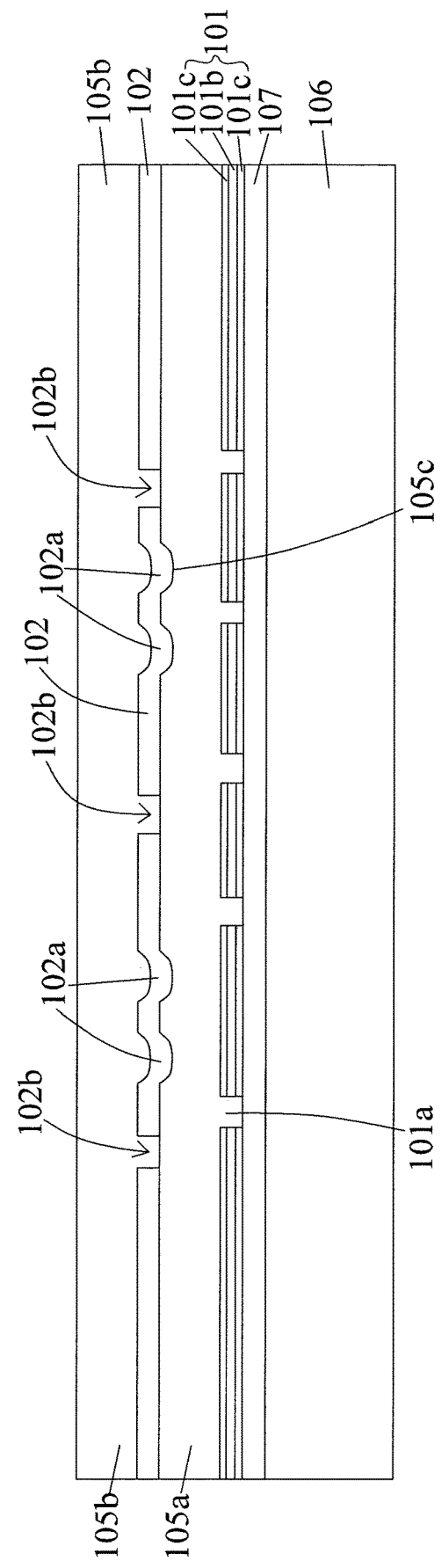
FIG. 5H is a cross-sectional view of a second sacrificial oxide layer disposed over a membrane and a first sacrificial oxide layer in accordance with some embodiments of the present disclosure.

In operation 506, a second sacrificial oxide layer 105b is disposed over a portion of the first sacrificial oxide layer 105a (exposed through the holes 102b) and surrounds the membrane 102 as shown in FIG. 5H. In some embodiments, the second sacrificial oxide layer 105b covers the first sacrificial oxide layer 105a. In some embodiments, the second sacrificial oxide layer 105b is disposed over the membrane 102 and the first sacrificial oxide layer 105a by any suitable deposition operations. In some embodiments, the second sacrificial oxide layer 105b includes same or different materials as the first sacrificial oxide layer 105a. In some embodiments, the second sacrificial oxide layer 105b includes dielectric material such as silicon oxide. In some embodiments, the second sacrificial oxide layer 105b has a thickness of about 0.3 µm to about 5 µm. In some embodiments, the second sacrificial oxide layer 105b is planarized to a reduced height than as deposited. In some embodiments, the second sacrificial oxide layer 105b is polished by chemical mechanical polishing (CMP) operations.

Figure 5I:
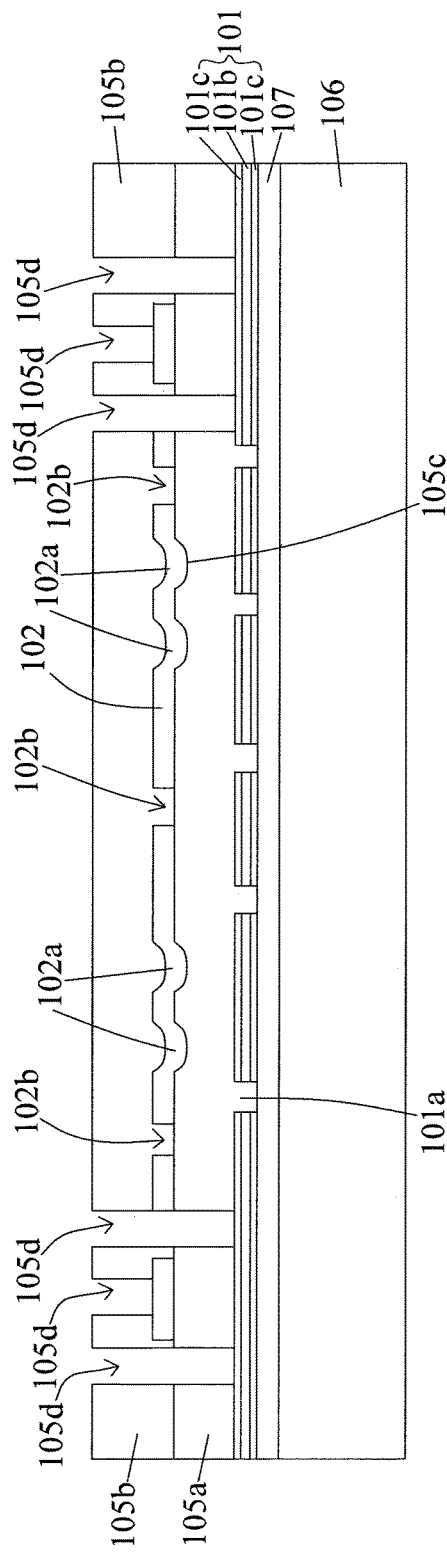
FIG. 5I is a cross-sectional view of several vias passing through a first sacrificial oxide layer and a second sacrificial oxide layer in accordance with some embodiments of the present disclosure.
Figure 5J:
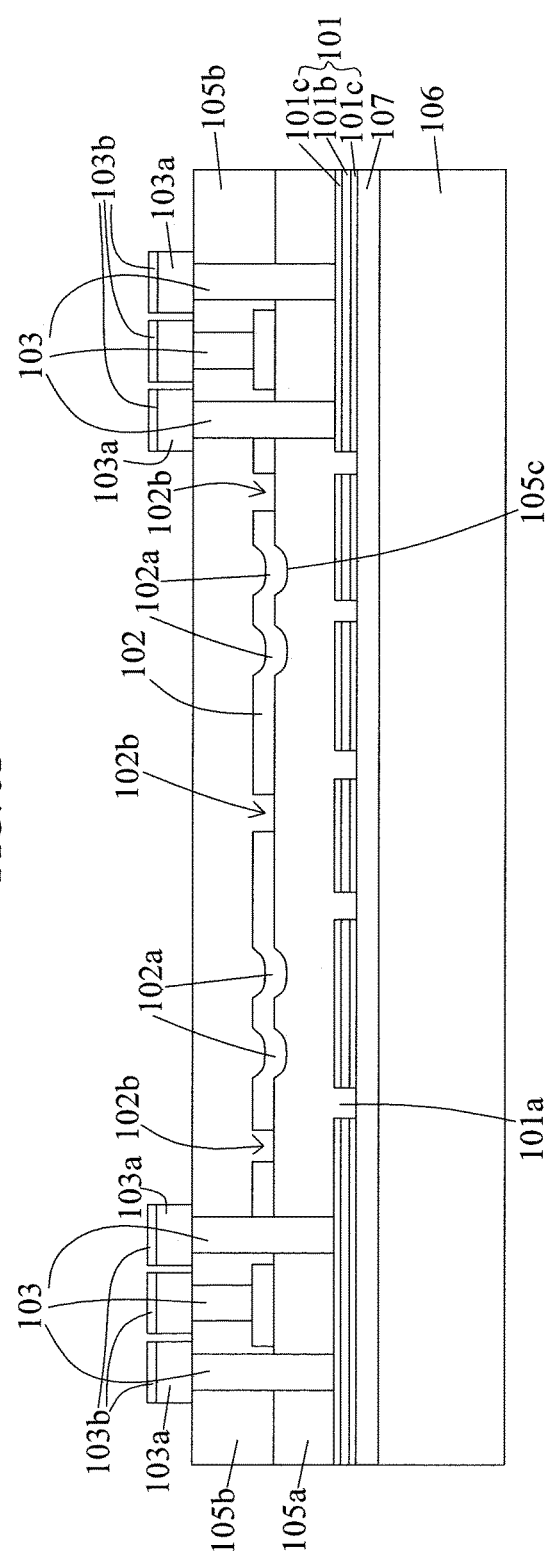
FIG. 5J is a cross-sectional view of several conductive plugs passing through a first sacrificial oxide layer and a second sacrificial oxide layer in accordance with some embodiments of the present disclosure.

In operation 507, several conductive plugs 103 are formed as shown in FIGS. 5I and 5J. In some embodiments, several vias 105d passing through the first sacrificial oxide layer 105a or the second sacrificial oxide layer 105b are formed as shown in FIG. 5I. In some embodiments, the vias 105d are formed by any suitable operation such as photolithography and etching. In some embodiments, some of the first sacrificial oxide layer 105a or the second sacrificial oxide layer 105b are removed and stopped at the plate 101 to form the vias 105d.

In some embodiments, the vias 105d are deposited and filled by semiconductive materials such as polysilicon to form several conductive plugs 103 as shown in FIG. 5J. In some embodiments, the conductive plugs 103 pass through the first sacrificial oxide layer 105a or the second sacrificial oxide layer 105b. In some embodiments, the conductive plug 103 is extended from the plate 101 through the membrane 102. In some embodiments, the conductive plug 103 is extended from or through the membrane 102. In some embodiments, the vias 105d could be a trench.

In some embodiments, the conductive plugs 103 are formed by removing some portions of the first sacrificial oxide layer 105a or the second sacrificial oxide layer 105b and then disposing polysilicon. In some embodiments, some portions of the first sacrificial oxide layer 105a or the second sacrificial oxide layer 105b are removed by photolithography and etching operations. In some embodiments, the polysilicon is disposed by any suitable deposition operations. The conductive plug 103 includes polysilicon. In some embodiments, the conductive plug 103 has a height of about 1 µm to about 50 µm. After formation of the conductive plugs 103, the conductive plugs 103 are planarized by any suitable polishing operations such as CMP operations. In some embodiments, the trench 105d could be filled with polysilicon.

In some embodiments, several standing off pads 103a are formed over the conductive plugs 103 respectively. In some embodiments, additional polysilicon is disposed over the second sacrificial oxide layer 105b and the conductive plugs 103, and then some portions of the additional polysilicon are removed by photolithography and etching operations to form the standing off pads 103a. In some embodiments, the standing off pad 103a has a height of about 1 µm to about 20 µm.

In some embodiments, several semiconductive material 103b are disposed over the standing off pads 103a respectively. In some embodiments, the semiconductive material 103b such as germanium are disposed over the conductive plugs 103a. In some embodiments, the semiconductive material 103b are disposed by any suitable operations such as sputtering, lithography and etching operations.

Figure 5K:
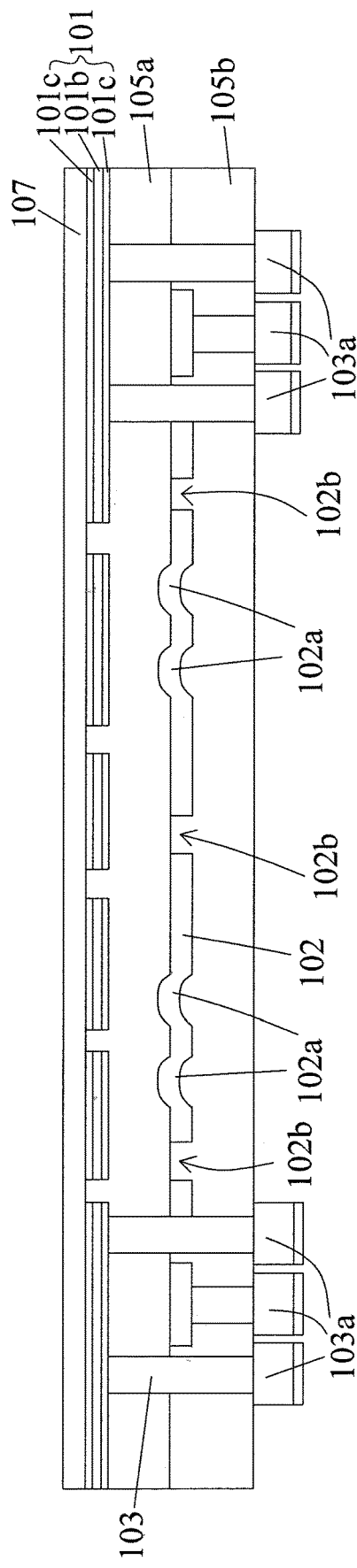
FIG. 5K is a cross-sectional view of a semiconductor structure without a first substrate in accordance with some embodiments of the present disclosure.

In operation 508, the first substrate 106 is thinned down or removed as shown in FIGS. 5K, 5L, 5M and 5N. In some embodiments as shown in FIG. 5K, the first substrate 106 is removed by any suitable operations such as grinding, etching, etc. In some embodiments, the first substrate 106 is removed by wet etching or dry etching. In some embodiments, the first substrate 106 is ground or etched until reaching the plate 101.

Figure 5L:
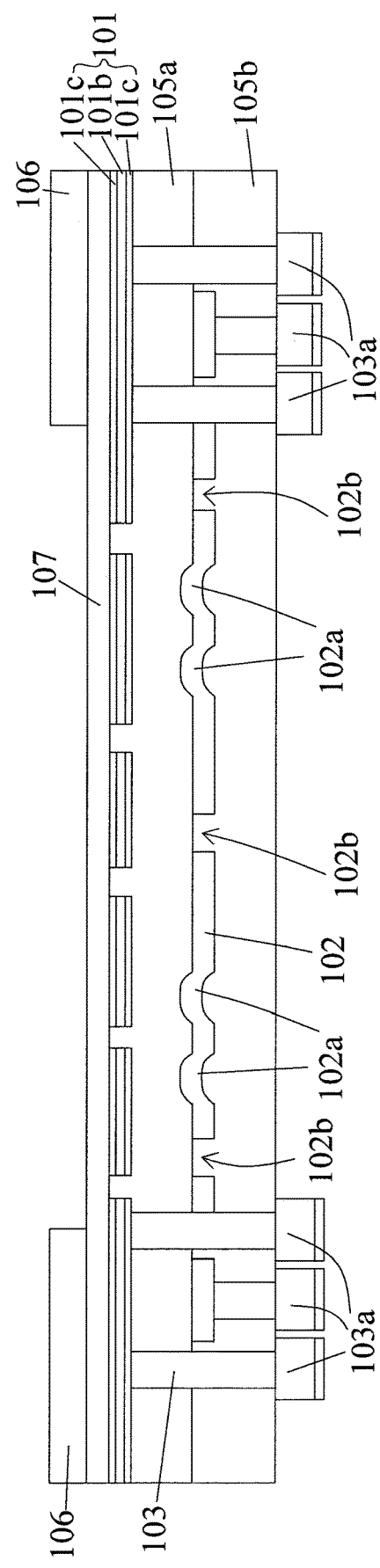
FIG. 5L is a cross-sectional view of a semiconductor structure without some portions of a first substrate in accordance with some embodiments of the present disclosure.

In some embodiments as shown in FIG. 5L, some portions of the first substrate 106 are removed to reduce a thickness of the first substrate 106. In some embodiments, the first substrate 106 is ground several times to thin down its thickness. In some embodiments, the first substrate 106 is etched in several times. In some embodiments, some portions of the first substrate 106 are removed to expose some of the oxide layer 107. In some embodiments, the first substrate 106 is flipped before the grinding or etching operations.

Figure 5M:
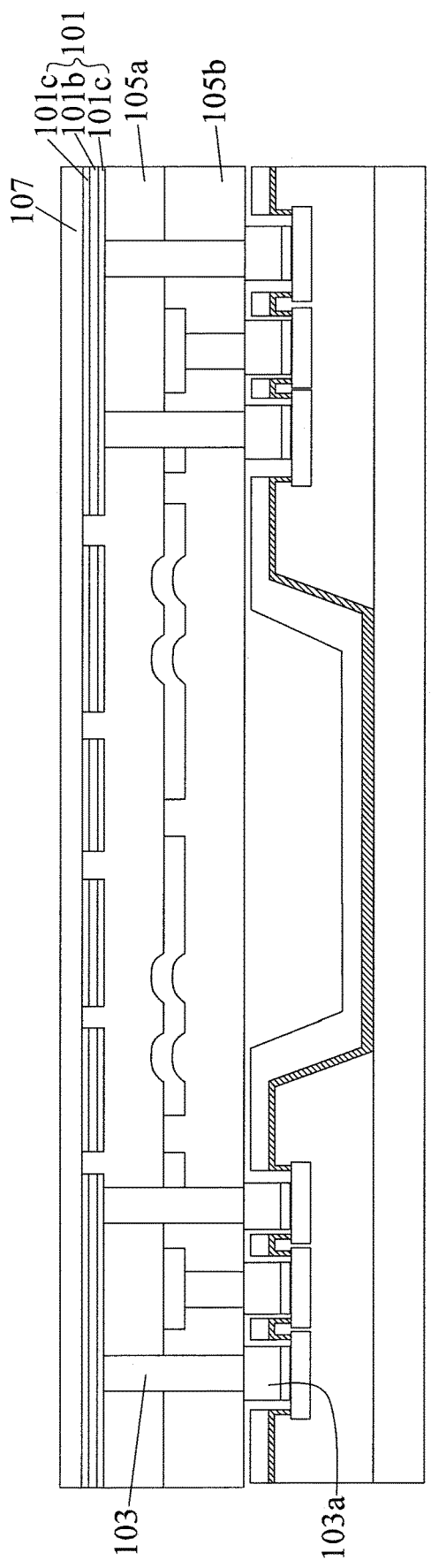
FIG. 5M is a cross-sectional view of a semiconductor structure disposed over another substrate in accordance with some embodiments of the present disclosure.
Figure 5N:
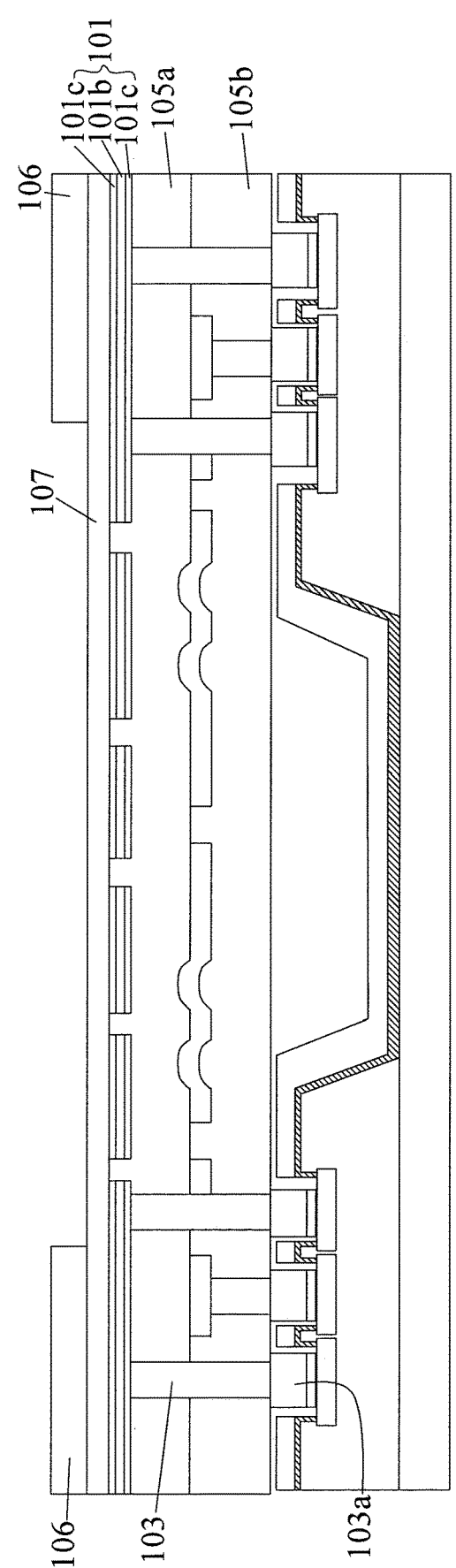
FIG. 5N is a cross-sectional view of a semiconductor structure disposed over another substrate in accordance with some embodiments of the present disclosure.

In some embodiments, the operation 508 is performed after bonding the first substrate 106 with another substrate as shown in FIGS. 5M and 5N. In some embodiments, the operation 508 is performed after bonding the conductive plugs 103 with another substrate. The first substrate 106 is supported by another substrate, and then the operation 508 is implemented and the first substrate 106 is thinned down or removed.

Figure 5O:
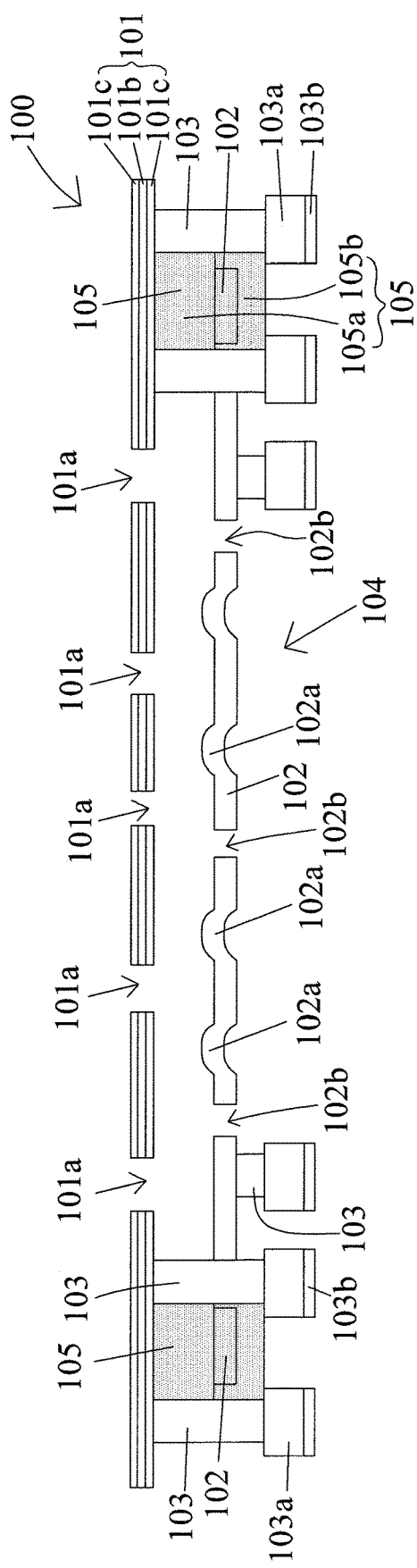
FIG. 5O is a cross-sectional view of a semiconductor structure with a membrane movable relative to a plate in accordance with some embodiments of the present disclosure.
Figure 5P:
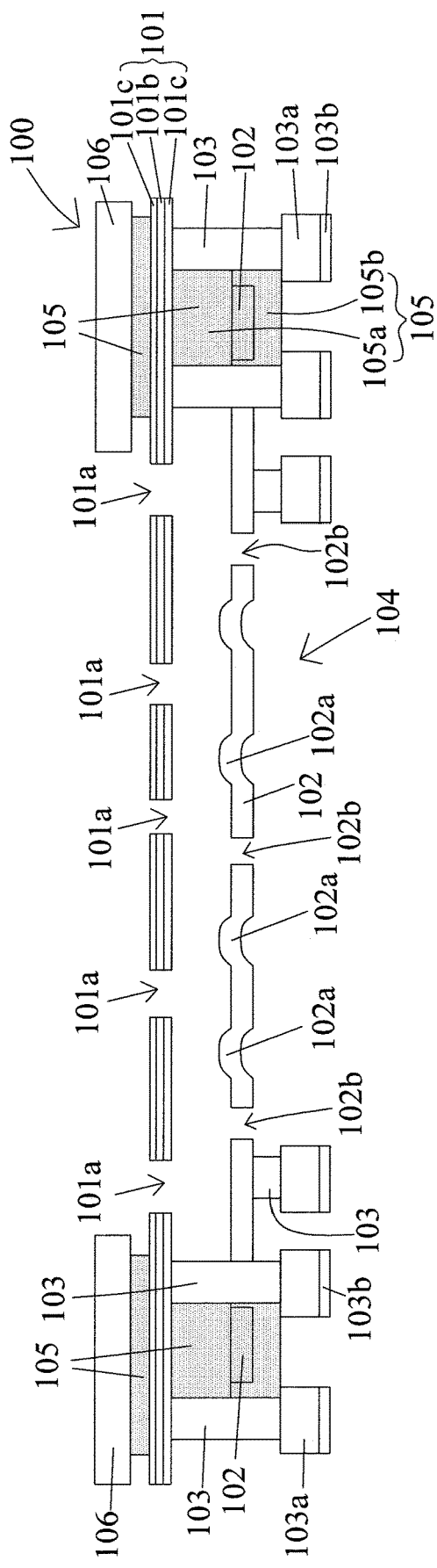
FIG. 5P is a cross-sectional view of a semiconductor structure with a membrane movable relative to a plate in accordance with some embodiments of the present disclosure.

In operation 509, some portions or all of the first sacrificial oxide layer 105a, the second sacrificial oxide layer 105b and the oxide layer 107 are removed as shown in FIGS. 5O and 5P. In some embodiments, the first sacrificial oxide layer 105a, the second sacrificial oxide layer 105b and the oxide layer 107 are removed by etching operations such as dry or wet etching. In some embodiments, a first cavity 104 is formed after removing the first sacrificial oxide layer 105a and the second sacrificial oxide layer 105b. In some embodiments, the first cavity 104 is aligned with the corrugations 102a of the membrane 102 or the apertures 101a of the plate 101.

In some embodiments, some portions of the first sacrificial oxide layer 105a and some portions of the second sacrificial oxide layer 105b are removed, so that some portions of the first sacrificial oxide layer 105a and the second sacrificial oxide layer 105b are remained. Those remained portions of the first sacrificial oxide layer 105a and the second sacrificial oxide layer 105b surround the conductive plugs 103. In some embodiments, some portions of the oxide layer 107 are removed, while some portions are remained. The remained portions of the oxide layer 107 are disposed between the first substrate 106 and the plate 101. In some embodiments, the remained first sacrificial oxide layer 105a, the remained second sacrificial oxide layer 105b and the remained oxide layer 107 act as an oxide 105 to surround the plate 101 and the membrane 102.

In some embodiments, a semiconductor structure 100 is formed. The semiconductor structure 100 has similar configuration as in any one of FIGS. 1, 2, 3A and 3B. The membrane 102 is displaceable relative to the plate 101 after the removal of the first sacrificial oxide layer 105a and the second sacrificial oxide layer 105b. In some embodiments, the membrane 102 is configured to sense an acoustic pressure. When the membrane 102 is displaced by an acoustic pressure, the displacement of the membrane 102 relative to the plate 101 is converted into an electrical signal corresponding to a magnitude and frequency of the displacement.

Figure 6:
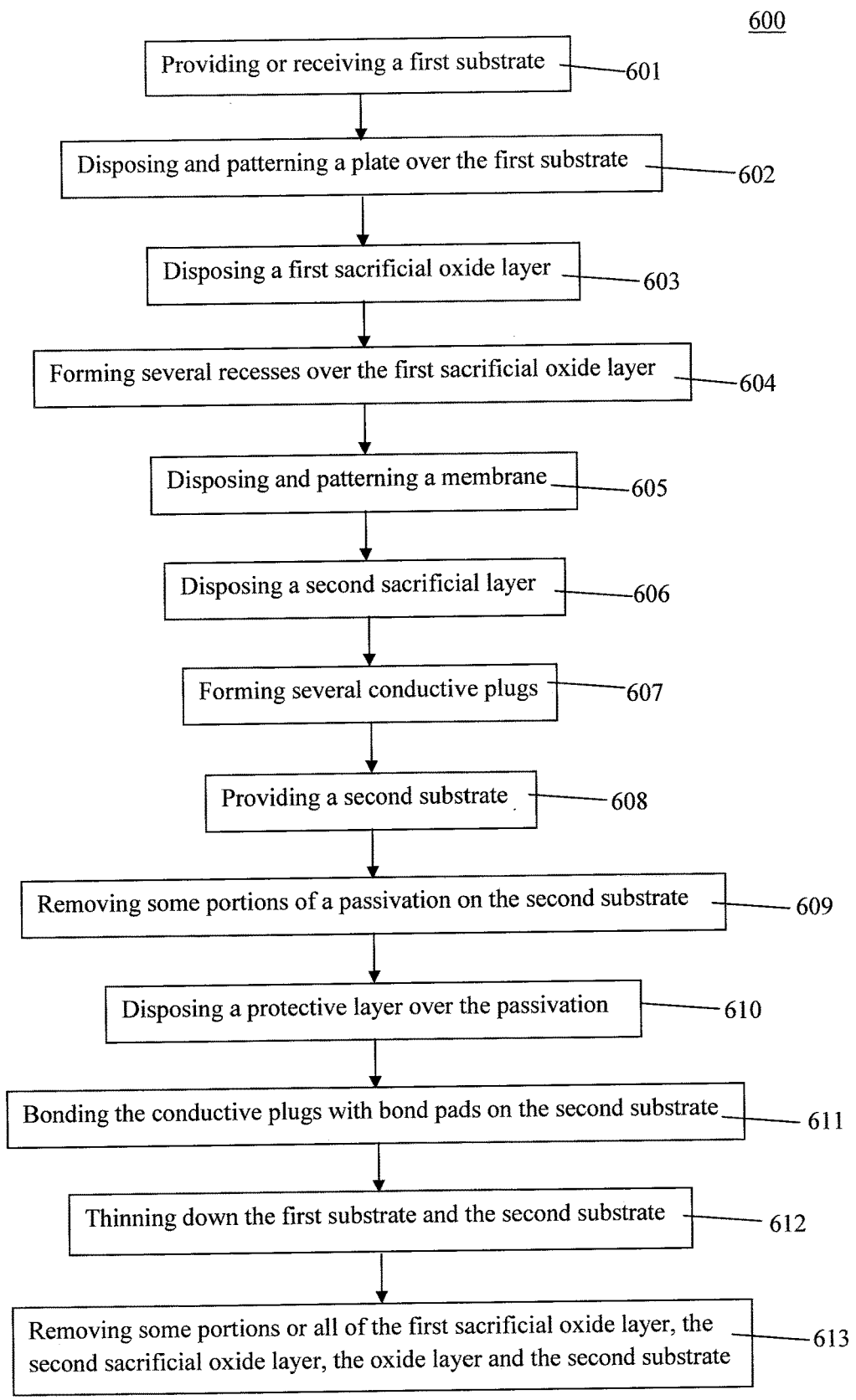
FIG. 6 is a flow diagram of a method of manufacturing a semiconductor structure in accordance with some embodiments of the present disclosure.

FIG. 6 is an embodiment of a method 600 of manufacturing a monolithic sensor. The method 600 includes a number of operations (601, 602, 603, 604, 605, 606, 607, 608, 609, 610, 611, 612 and 613).

Figure 6A:
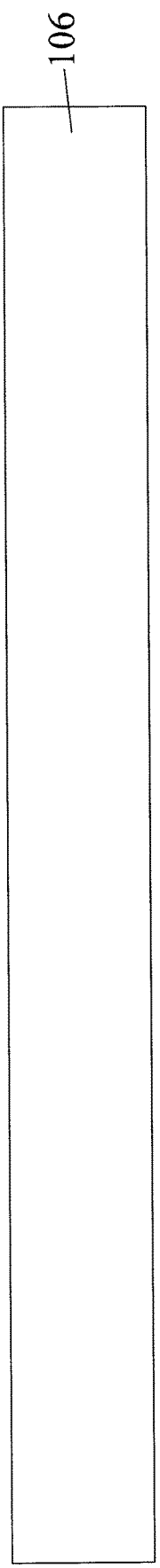
FIG. 6A is a cross-sectional view of a first substrate in accordance with some embodiments of the present disclosure.
Figure 6B:
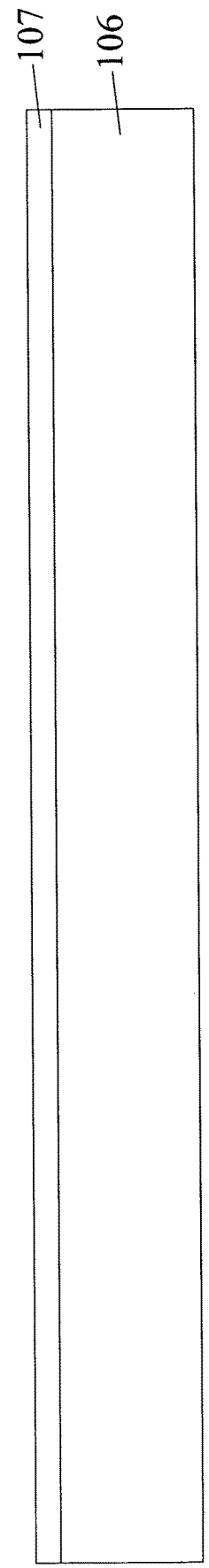
FIG. 6B is a cross-sectional view of a first substrate with an oxide layer in accordance with some embodiments of the present disclosure.
Figure 6C:
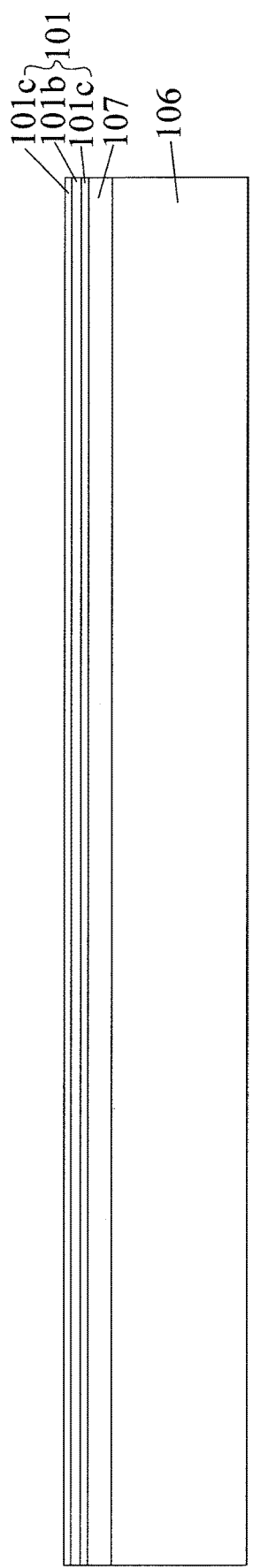
FIG. 6C is a cross-sectional view of a plate in accordance with some embodiments of the present disclosure.
Figure 6D:
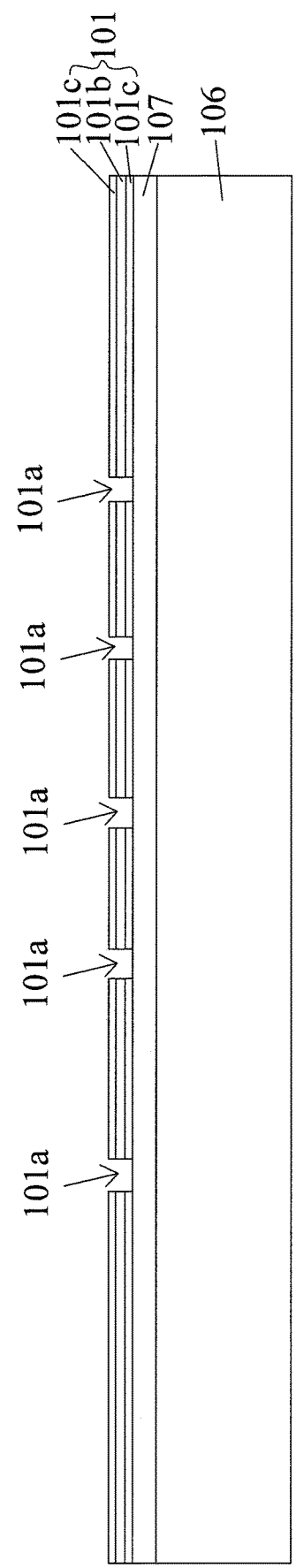
FIG. 6D is a cross-sectional view of a patterned plate in accordance with some embodiments of the present disclosure.
Figure 6E:
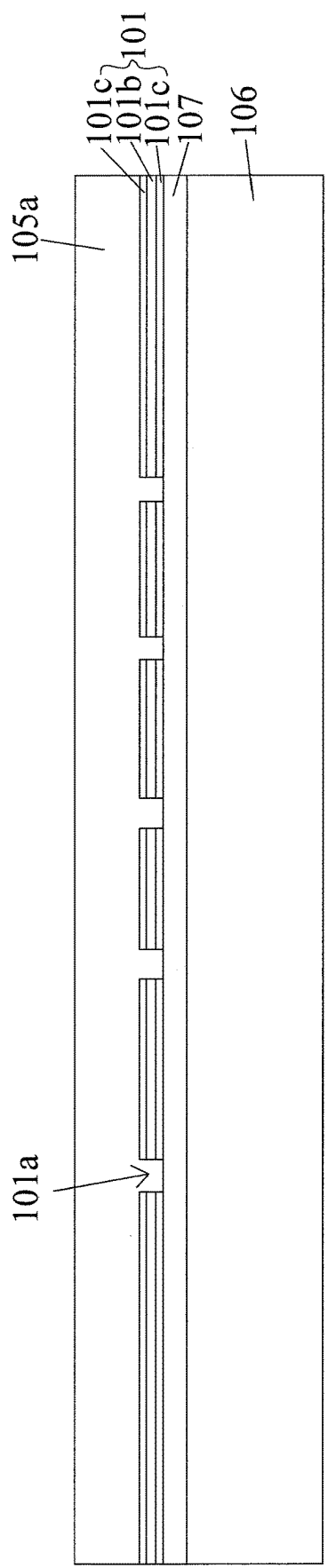
FIG. 6E is a cross-sectional view of a first sacrificial oxide layer disposed over a first substrate in accordance with some embodiments of the present disclosure.
Figure 6F:
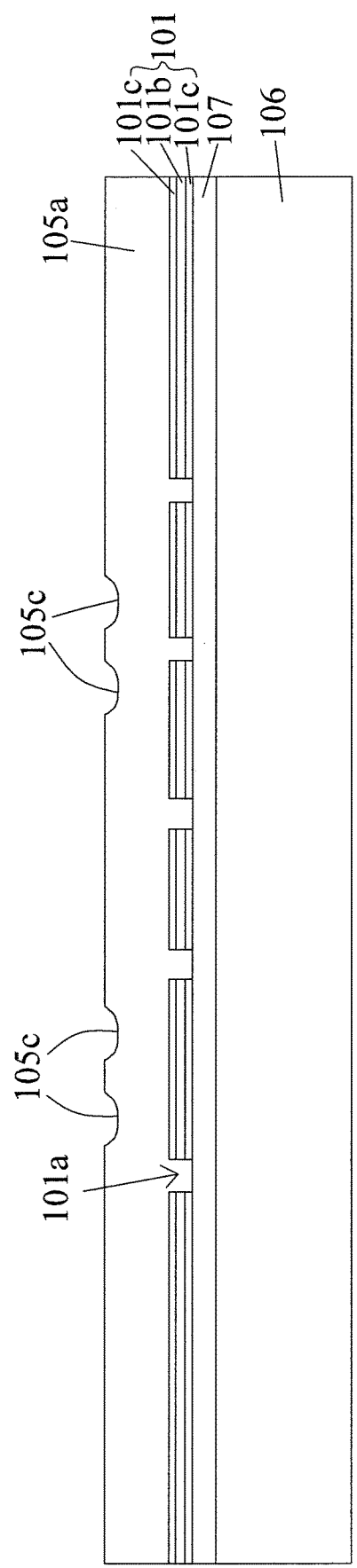
FIG. 6F is a cross-sectional view of several recesses disposed over a first sacrificial oxide layer in accordance with some embodiments of the present disclosure.
Figure 6G:
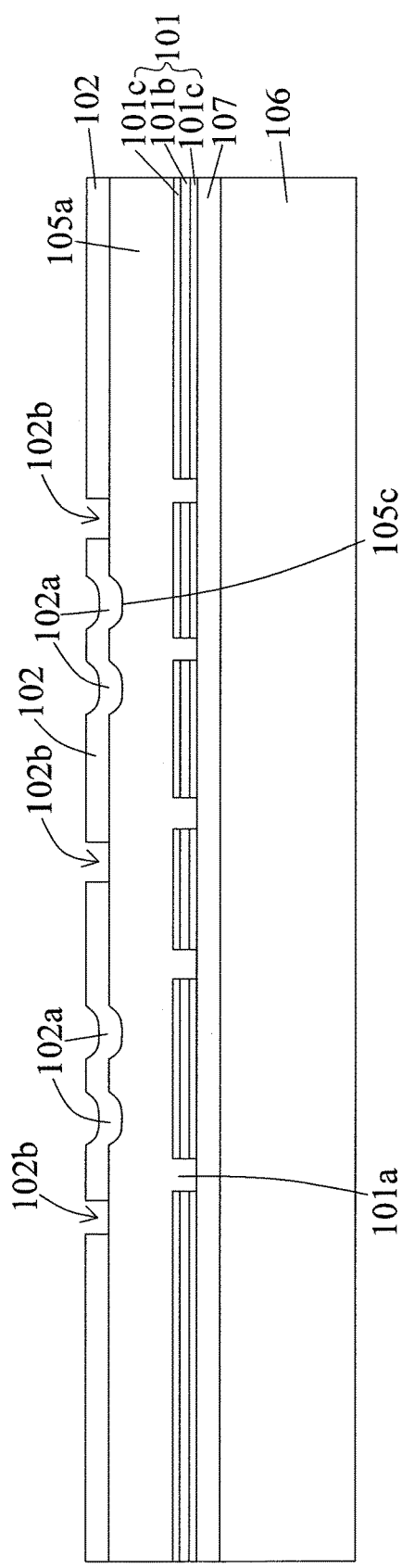
FIG. 6G is a cross-sectional view of a membrane disposed over a first sacrificial oxide layer in accordance with some embodiments of the present disclosure.
Figure 6H:
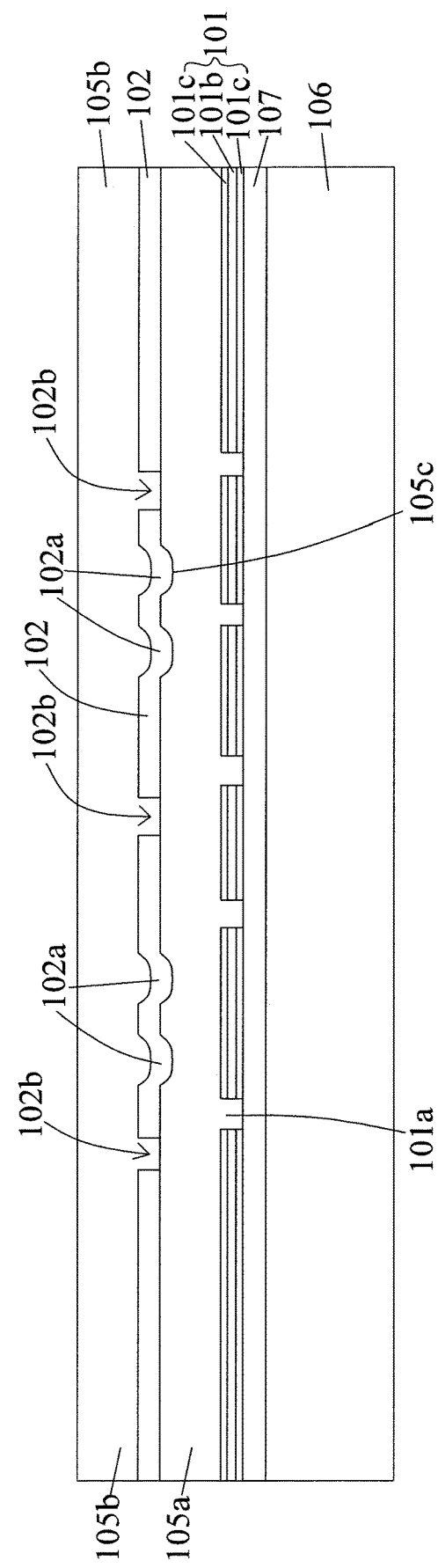
FIG. 6H is a cross-sectional view of a second sacrificial oxide layer disposed over a membrane and a first sacrificial oxide laser accordance with some embodiments of the present disclosure.
Figure 6I:
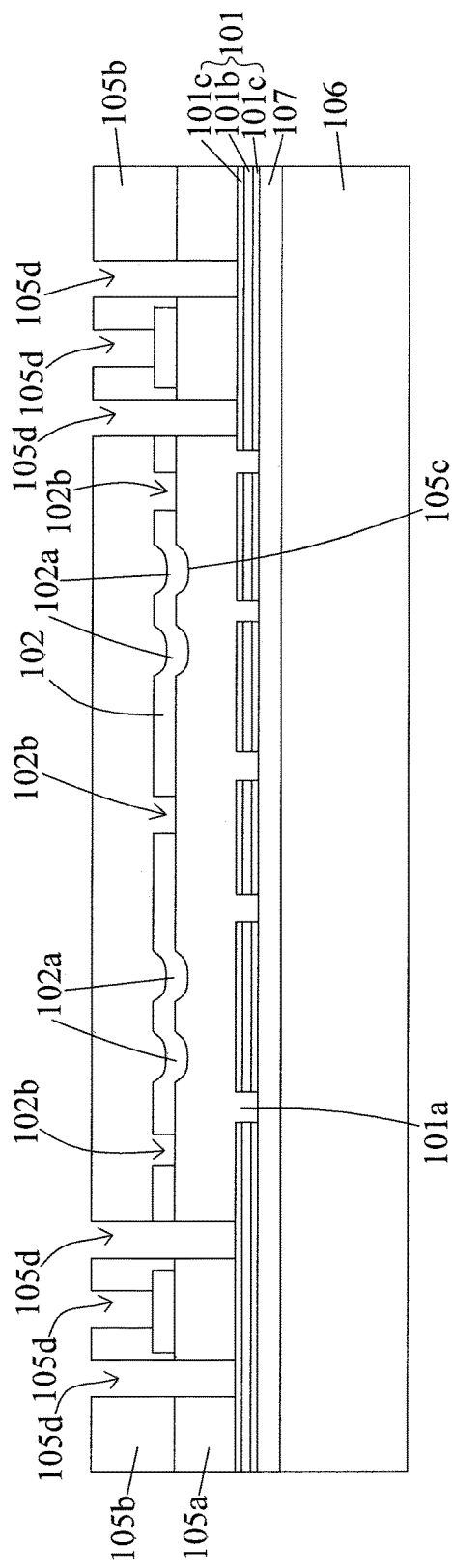
FIG. 6I is a cross-sectional view of several vias passing through a first sacrificial oxide layer and a second sacrificial oxide layer in accordance with some embodiments of the present disclosure.
Figure 6J:
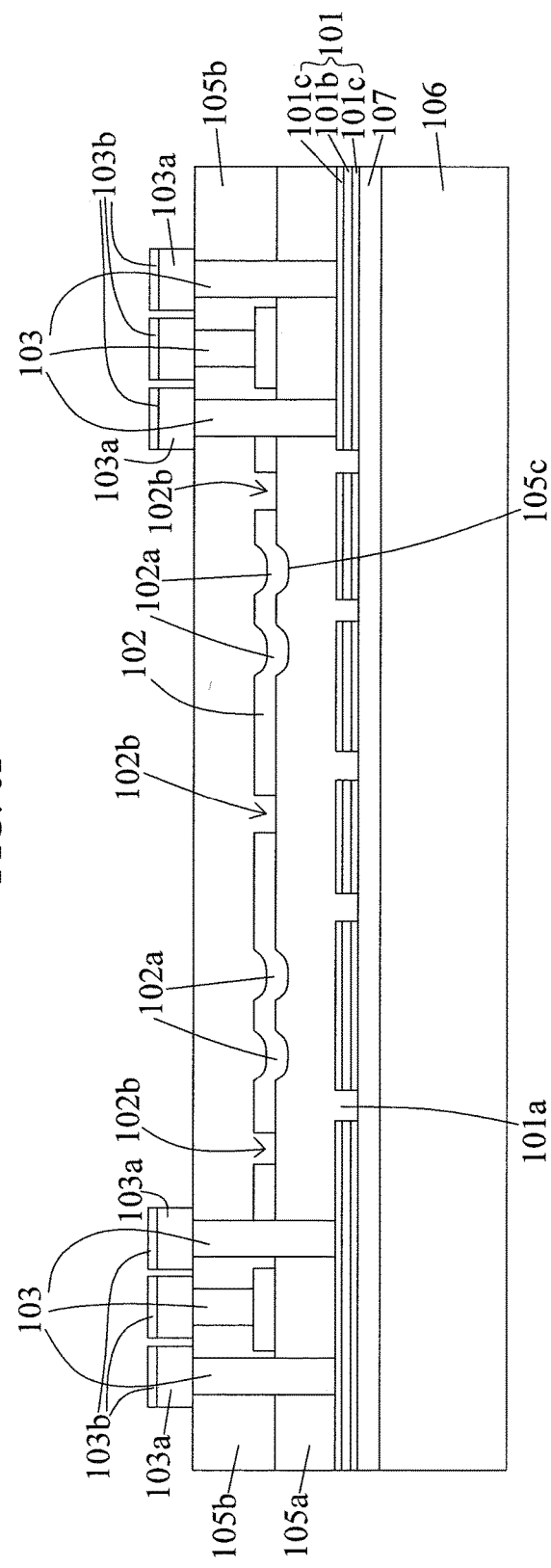
FIG. 6J is a cross-sectional view of several conductive plugs passing through a first sacrificial oxide layer and a second sacrificial oxide layer in accordance with some embodiments of the present disclosure.

In operation 601, a first substrate 106 is received or provided as shown in FIGS. 6A and 6B. The operation 601 is similar to the operation 501 in FIGS. 5A and 5B. In operation 602, a plate 101 is disposed and patterned as shown in FIGS. 6C and 6D. The operation 602 is similar to the operation 502 in FIGS. 5C and 5D. In operation 603, a first sacrificial oxide layer 105a is disposed as shown in FIG. 6E. The operation 603 is similar to the operation 503 in FIG. 5E. In operation 604, several recesses 105c are formed as shown in FIG. 6F. The operation 604 is similar to the operation 604 in FIG. 5F. In operation 605, a membrane 102 is disposed and patterned as shown in FIG. 6G. The operation 605 is similar to the operation 505 in FIG. 5G. In operation 606, a second sacrificial layer 105b is disposed as shown in FIG. 6H. The operation 606 is similar to the operation 506 in FIG. 5H. In operation 607, several conductive plugs 103 are formed as shown in FIGS. 6I and 6J. The operation 607 is similar to the operation 507 in FIGS. 5I and 5J. In some embodiments, several standing off pads 103a and semiconductive material 103b are disposed over the conductive plugs 103.

Figure 6K:
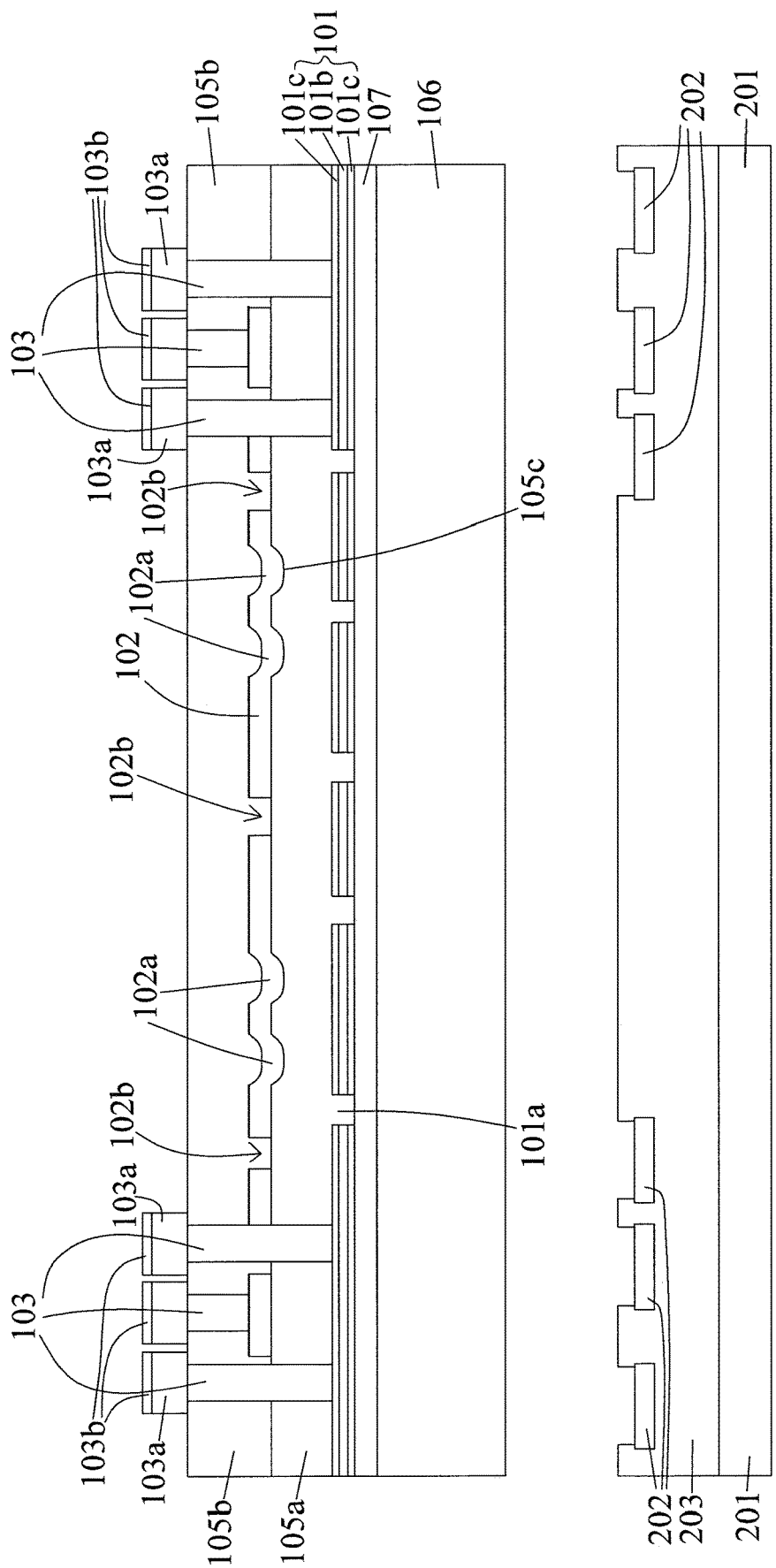
FIG. 6K is a cross-sectional view of a second device in accordance with some embodiments of the present disclosure.

In operation 608, a second substrate 201 is provided or received as shown in FIG. 6K. In some embodiments, the second substrate 201 includes several active devices such as CMOS device. In some embodiments, the second substrate 201 is a CMOS substrate. In some embodiments, the second substrate 201 includes a layer 203 disposed over the second substrate 201 and several bond pads 202 disposed over the layer 203. In some embodiments, the layer 203 includes CMOS device and inter metal connection (circuitry). In some embodiments, the bond pads 202 are surrounded by the layer 203. In some embodiments, a top surface of the bond pad 202 is exposed from the layer 203. In some embodiments, the bond pads 202 are configured to receive external interconnect structure in order to electrically connect circuitry in the second substrate 201 with another substrate.

Figure 6L:
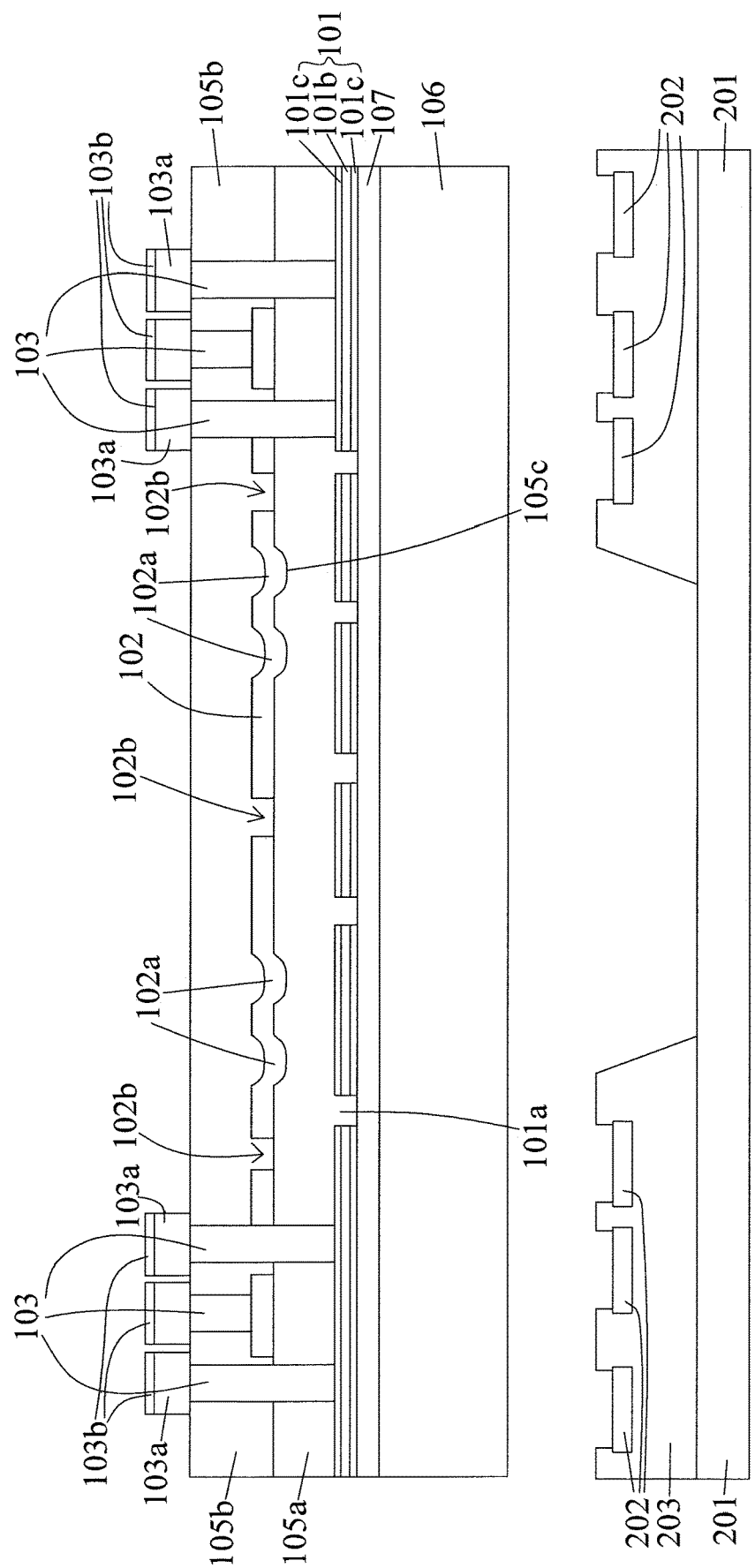
FIG. 6L is a cross-sectional view of a partially removed layer in accordance with some embodiments of the present disclosure.

In operation 609, some portions of the layer 203 are removed as shown in FIG. 6L. In some embodiments, some portions of the layer 203 are removed by any suitable operations such as photolithography and etching.

Figure 6M:
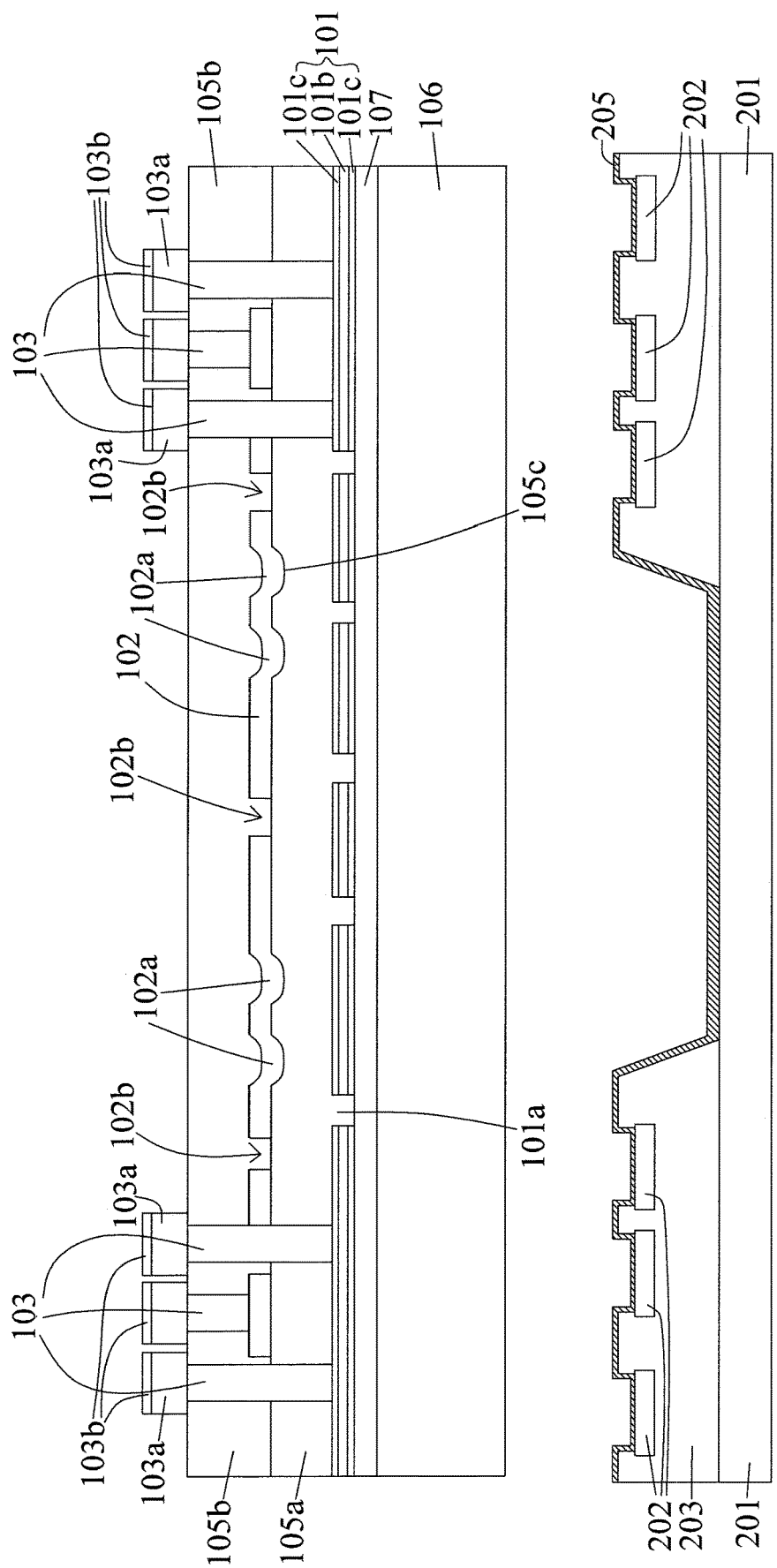
FIG. 6M is a cross-sectional view of a protective layer disposed over a second device in accordance with some embodiments of the present disclosure.

In operation 610, a protective layer 205 is disposed over the layer 203, the bond pads 202 and the second substrate 201 as shown in FIG. 6M. In some embodiments, the protective layer 205 is configured to prevent the second substrate 201, the layer 203, the bond pad 202 or other components disposed over the second substrate 201 from being etched or removed. In some embodiments, the protective layer 205 is an etching stop layer to prevent the second substrate 201 and the components disposed over the second substrate 201 from being attacked by hydrofluoric acid vapor.

Figure 6N:
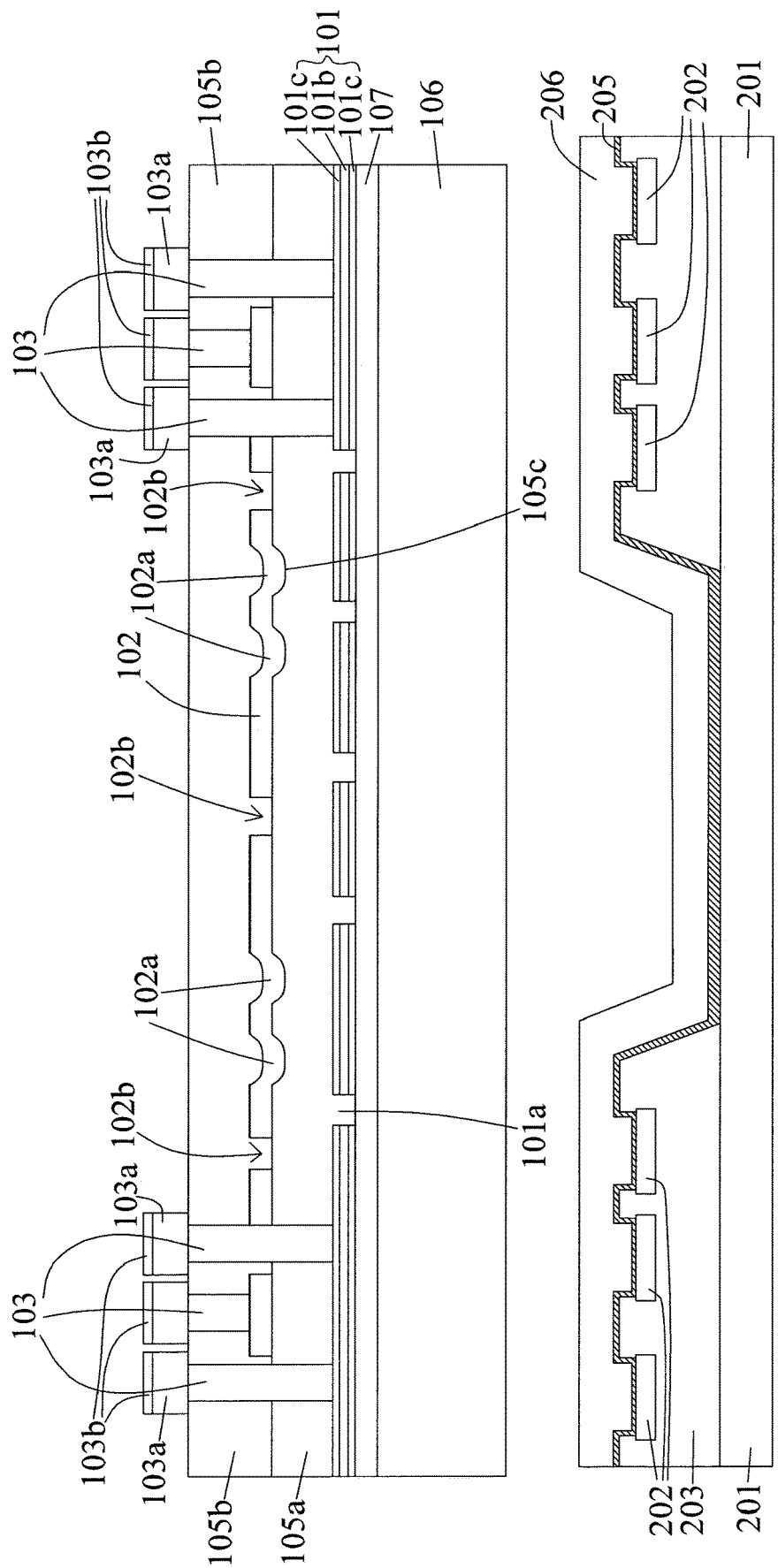
FIG. 6N is a cross-sectional view of an additional oxide layer disposed over a protective layer in accordance with some embodiments of the present disclosure.
Figure 6O:
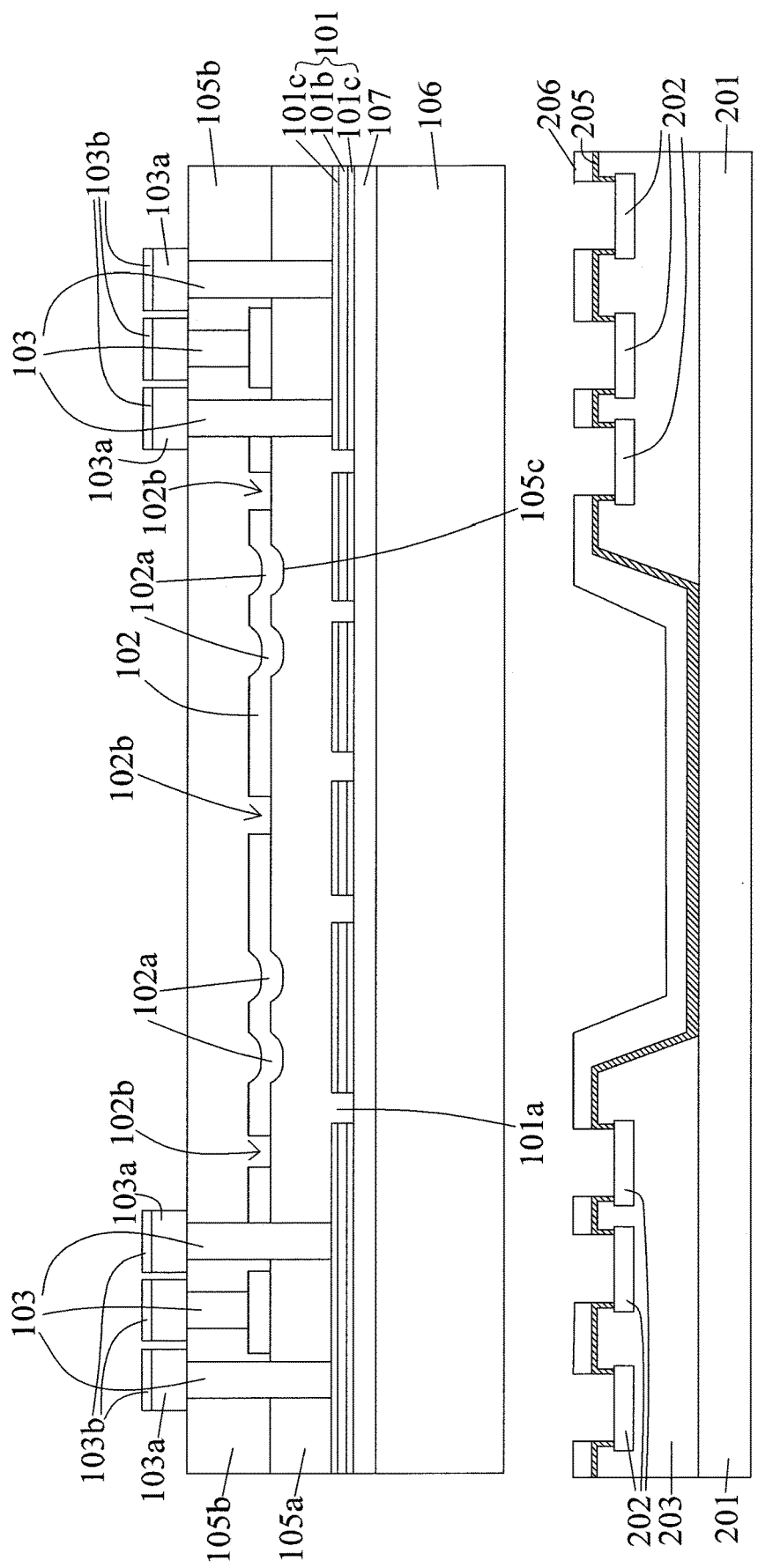
FIG. 6O is a cross-sectional view of several bond pads exposed from a protective layer and an additional oxide layer in accordance with some embodiments of the present disclosure.

In some embodiments, an additional oxide layer 206 is disposed over the protective layer 205 as shown in FIG. 6N. In some embodiments, the protective layer 205 and the additional oxide layer 206 disposed on the bond pads 202 are removed as shown in FIG. 6O. The bond pads 202 are exposed from the layer 203, the protective layer 205 and the additional oxide layer 206.

Figure 6P:
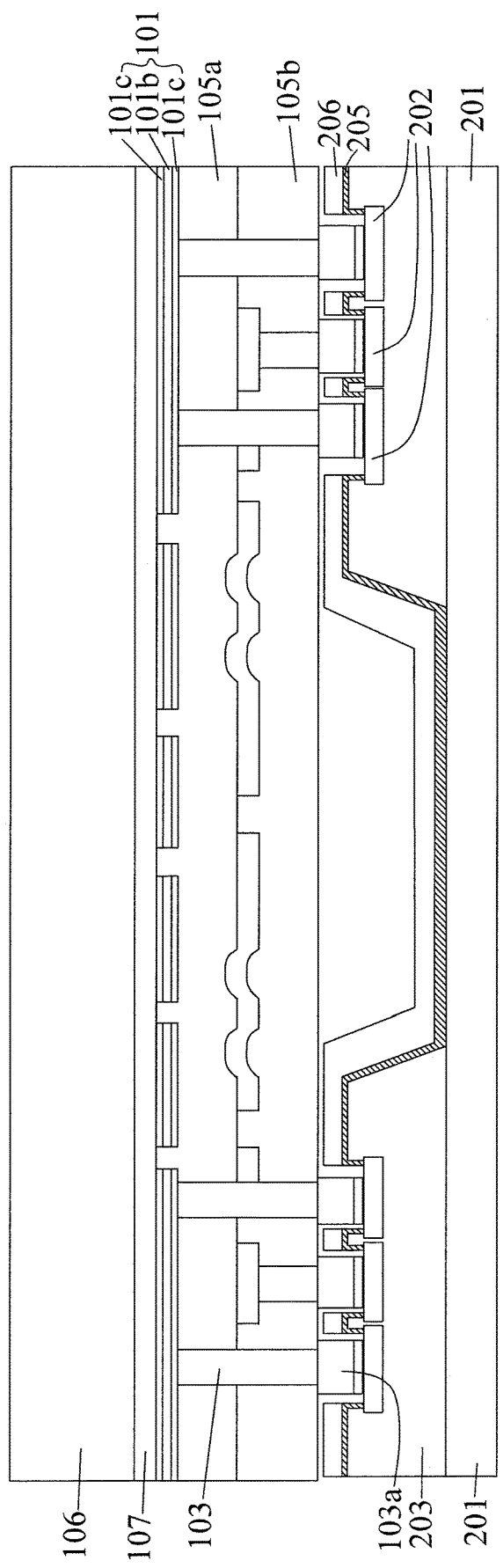
FIG. 6P is a cross-sectional view of a first device bonded with a second device in accordance with some embodiments of the present disclosure.

In operation 611, the conductive plugs 103 are bonded with the bond pads 202 as shown in FIG. 6P. In some embodiments, the first substrate 106 is flipped and then the conductive plugs 103 are bonded with the bond pads 202. The first substrate 106 is bonded with the second substrate 201 by the conductive plugs 103 and the bond pads 202, such that the first substrate 106, the plate 101, the membrane 102 and the second substrate 201 are electrically connected. In some embodiments, the standing off pads 103a or the semiconductive material 103b are bonded with the bond pads 202.

Figure 6Q:
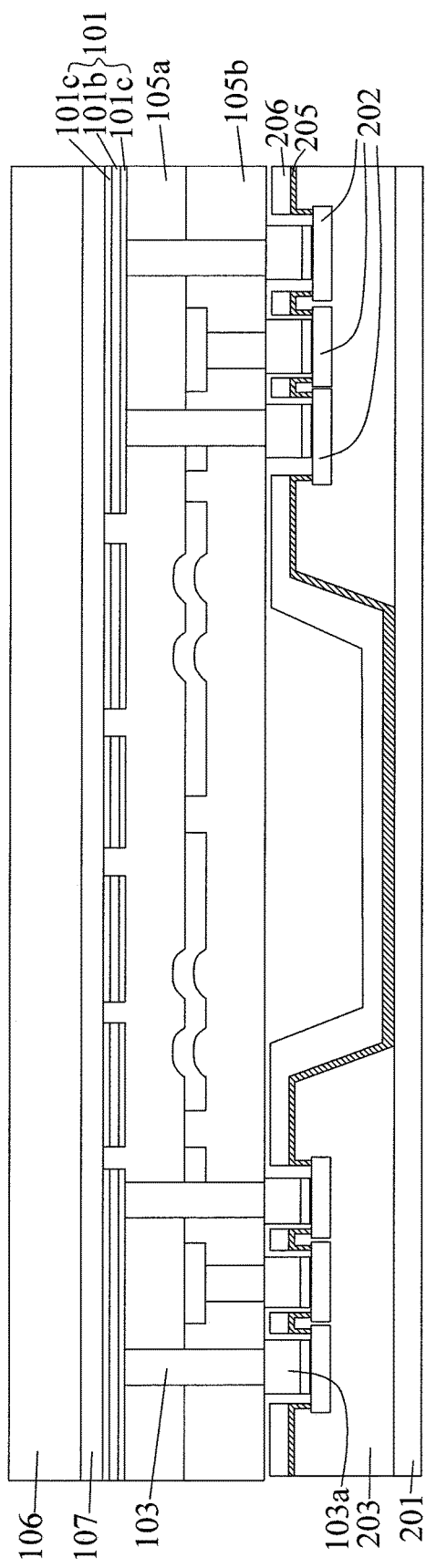
FIG. 6Q is a cross-sectional view of a semiconductor structure with a thinned first substrate in accordance with some embodiments of the present disclosure.
Figure 6R:
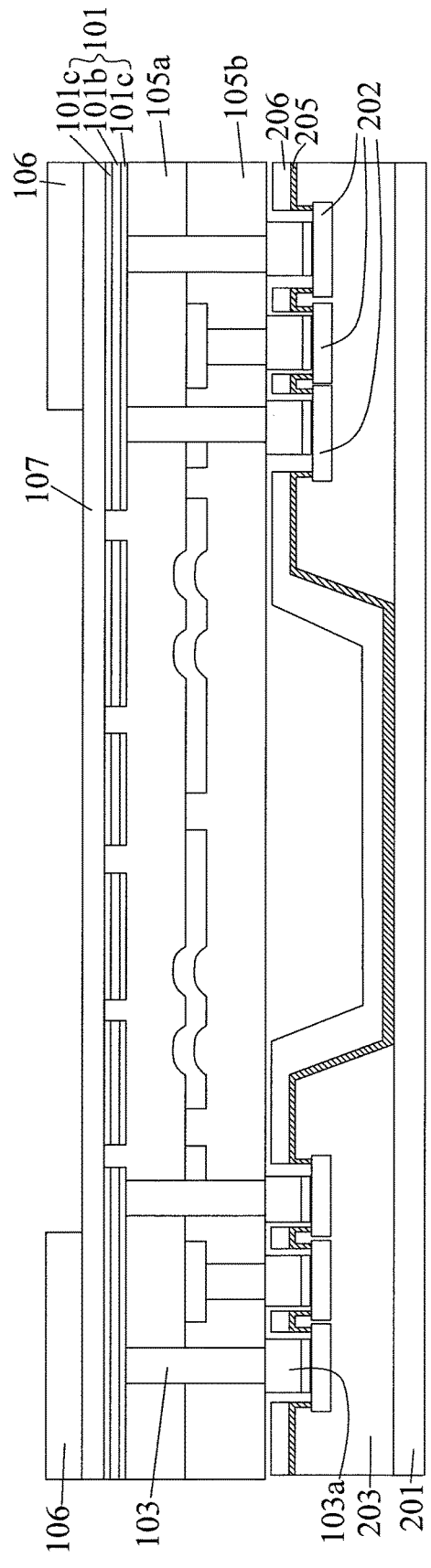
FIG. 6R is a cross-sectional view of a semiconductor structure with some portions of a first substrate in accordance with some embodiments of the present disclosure.

In operation 612, the first substrate 106 and the second substrate 201 are thinned down as shown in FIGS. 6Q and 6R. In some embodiments as shown in FIG. 6Q, the first substrate 106 and the second substrate 201 are thinned down in thickness. In some embodiments, the first substrate 106 and the second substrate 201 are thinned down by grinding operations. In some embodiments as shown in FIG. 6R, the first substrate 106 is wholly or partially removed. In some embodiments, some portions or all of the first substrate 106 are removed by grinding or etching operations. In some embodiments, the first substrate 106 is thinned down or removed by dry or wet etching. In some embodiments, the dry or wet etching of the first substrate 106 is stopped at the oxide layer 107. In some embodiments, the second substrate 201 is thinned down from the thickness of about 800 μm to about 100 μm.

Figure 6S:
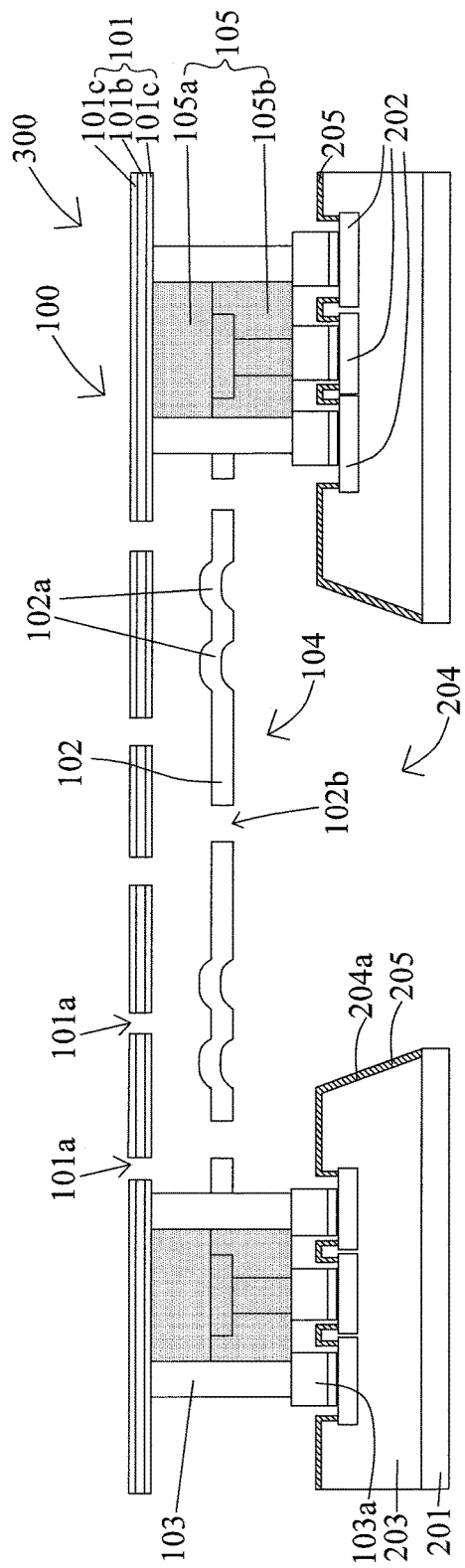
FIG. 6S is a cross-sectional view of a semiconductor structure with a membrane movable relative to a plate in accordance with some embodiments of the present disclosure.
Figure 6T:
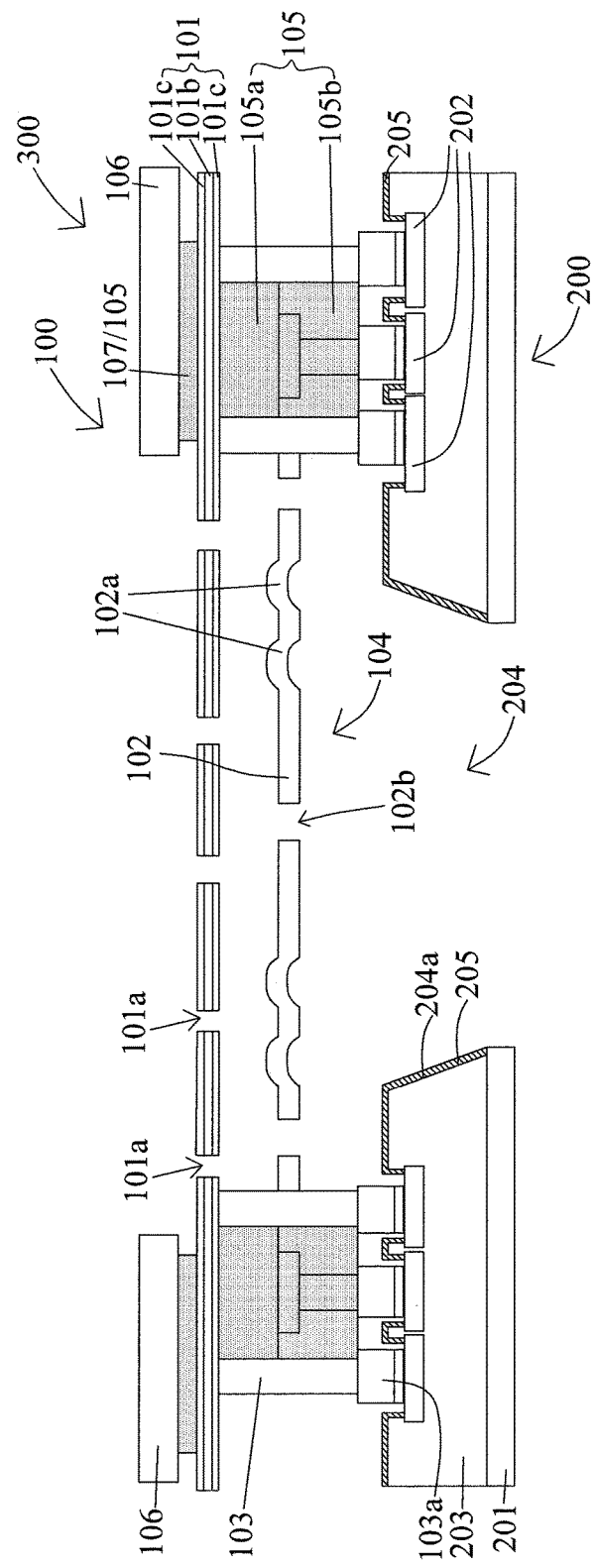
FIG. 6T is a cross-sectional view of a semiconductor structure with a membrane movable relative to a plate in accordance with some embodiments of the present disclosure.

In operation 613, some portions or all of the first sacrificial oxide layer 105a, the second sacrificial oxide layer 105*b*, the oxide layer 107 and the second substrate 201 are removed as shown in FIGS. 6S and 6T. In some embodiments, a first cavity 104 is formed by removing the first sacrificial oxide layer 105*a* and the second sacrificial oxide layer 105*b*. In some embodiments, a second cavity 204 is formed by removing some portions of the second substrate 201, some portions of the protective layer 205 and the additional oxide layer 206. In some embodiments, the second cavity 204 passes through the second substrate 201 and the layer 203. In some embodiments, the second cavity 204 is aligned with the first cavity 104.

In some embodiments, some portions of the first sacrificial oxide layer 105*a*, the second sacrificial oxide layer 105*b* and the oxide layer 107 are remained. The remained first sacrificial oxide layer 105*a*, the remained second sacrificial oxide layer 105*b* and the remained oxide layer 107 are served as an oxide 105 to surround a peripheral portion of the plate 101 and the membrane 102.

In some embodiments, a monolithic sensor 300 is formed. The monolithic sensor 300 includes a semiconductor structure 100 and a semiconductor structure 200. The semiconductor structure 100 and the semiconductor structure 200 have similar configuration as in FIG. 4. In some embodiments, the plate 101, the membrane 102, the conductive plug 103, the oxide 105, the second substrate 201, the bond pad 202, the layer 203 and the protective layer 205 have similar configuration as in FIGS. 4A and 4B.

The membrane 102 is displaceable relative to the plate 101 after the removal of the first sacrificial oxide layer 105*a* and the second sacrificial oxide layer 105*b*. In some embodiments, the membrane 102 is configured to sense an acoustic pressure. When the membrane 102 is displaced by an acoustic pressure, the displacement of the membrane 102 relative to the plate 101 is converted into an electrical signal corresponding to a magnitude and frequency of the displacement. The electrical signal is generated by the active device and the circuitry over the second substrate 201.

In the present disclosure, an improved semiconductor structure is disclosed. The semiconductor structure includes a plate and a membrane. In some embodiments, the semiconductor structure includes several plates. In some embodiments, the plate includes semiconductive member and a tensile member. The semiconductive member is sandwiched by the tensile member so as to have sufficient rigidity for resisting residual stress developed during manufacturing and the acoustic pressure striking thereon. Thus, the plate would not have undesired bending and a straightness of the plate can be maintained during manufacturing or during use. Thus, a noise is reduced, the SNR is increased. The performance of the microphone is improved.

In some embodiments, a method of manufacturing a semiconductor structure is provided. The method includes providing a first substrate, disposing and patterning a plate over the first substrate, disposing a first sacrificial oxide layer over the plate, forming a plurality of recesses over a surface of the first sacrificial oxide layer, disposing and patterning a membrane over the first sacrificial oxide layer, disposing a second sacrificial oxide layer to surround the membrane and cover the first sacrificial oxide layer; and forming a plurality of conductive plugs passing through the plate or the membrane, wherein the plate includes a semiconductive member and a tensile member, and the semiconductive member is disposed within the tensile member.

In some embodiments, a method of manufacturing a semiconductor structure is provided. The method includes providing a first substrate, forming a plate over the first substrate, forming a membrane including a plurality of holes over and separated from the plate, forming a plurality of conductive plugs passing through the plate or the membrane, forming a plurality of semiconductive pads over the plurality of conductive plugs, and bonding the plate to a second substrate. In some embodiments, the plate includes a first tensile member, a second tensile member, a semiconductive member between the first tensile member and the second tensile member, and a plurality of apertures penetrating the first tensile member, the semiconductive member and the second tensile member. In some embodiments, the second substrate includes a plurality of bond pads. In some embodiment, the semiconductive pads are in contact with the bond pads.

In some embodiments, a method of manufacturing a semiconductor structure is provided. The method includes providing a first substrate, forming a plate over the first substrate, disposing a first sacrificial layer over the plate, forming a plurality of recesses over a surface of the first sacrificial layer, forming a membrane over the first sacrificial layer, disposing a second sacrificial layer to surround the membrane and cover the first sacrificial layer, forming a plurality of conductive plugs passing through the plate or the membrane, providing a second substrate, and bonding the first substrate to the second substrate. In some embodiments, the second substrate includes a passivation, a plurality of bond pads surrounded by the passivation, and a protecting layer over the passivation. In some embodiments, the plate includes a semiconductive member and a tensile member. The semiconductive member is disposed within the tensile member. The semiconductor pads are in contact with the bond pads.

The foregoing outlines features of several embodiments so that those skilled in the art may hotter understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a first substrate;
   disposing and patterning a plate over the first substrate;
   disposing a first sacrificial oxide layer over the plate;
   forming a plurality of recesses over a surface of the first sacrificial oxide layer;
   disposing and patterning a membrane over the first sacrificial oxide layer;
   disposing a second sacrificial oxide layer to surround the membrane and cover the first sacrificial oxide layer; and
   forming a plurality of conductive plugs passing through the plate or the membrane, wherein the plate includes a semiconductive member and a tensile member, and the semiconductive member is disposed within the tensile member.

2. The method of claim 1, wherein the disposing and patterning the membrane includes forming a plurality of corrugations and a plurality of holes.

3. The method of claim 1, wherein the disposing and patterning the plate includes forming a plurality of apertures passing through the plate.

4. The method of claim 1, further comprising:
providing a second substrate including a plurality of bond pads surrounded by a layer;
flipping the first substrate;
bonding the first substrate with the second substrate by the plurality of bond pads and the plurality of conductive plugs;
thinning down the first substrate and the second substrate;
partially or wholly removing the first substrate;
removing the first sacrificial oxide layer and the second sacrificial oxide layer to form a first cavity; and
removing some portions of the second substrate and some portions of the layer to form a second cavity aligned with the first cavity and passing through the layer and the second substrate.

5. The method of claim 4, wherein some portions of the first sacrificial oxide layer and some portions of the second sacrificial oxide layer surrounded by the plurality of conductive plugs are remained after the removing of the first sacrificial oxide layer and the second sacrificial oxide layer.

6. The method of claim 4, further comprising:
displacing the membrane by an acoustic pressure entering from the second cavity and impinged on the membrane to vary a capacitance between the plate and the membrane; and
converting to an electrical signal corresponding to a magnitude and frequency of a displacement of the membrane by a CMOS device.

7. The method of claim 1, further comprising disposing an oxide layer over the first substrate, wherein the oxide layer is disposed between the first substrate and the plate.

8. A method of manufacturing a semiconductor structure, comprising:
providing a first substrate;
forming a plate over the first substrate;
disposing a first sacrificial layer over the plate;
forming a plurality of recesses over a surface of the first sacrificial layer;
forming a membrane over the first sacrificial layer;
disposing a second sacrificial layer to surround the membrane and cover the first sacrificial layer;
forming a plurality of conductive plugs passing through the plate or the membrane;
providing a second substrate comprising a passivation, a plurality of bond pads surrounded by the passivation, and a protecting layer over the passivation; and
bonding the first substrate to the second substrate,
wherein the plate includes a semiconductive member and a tensile member, the semiconductive member is disposed within the tensile member, and the semiconductive pads are in contact with the bond pads.

9. The method of claim 8, further comprising thinning down the first substrate and the second substrate after the bonding of the first substrate to the second substrate.

10. The method of claim 8, further comprising:
removing a portion of the passivation to expose a portion of the second substrate; and
forming the protecting layer to cover the plurality of bond pads, the passivation and the exposed portion of the second substrate.

11. The method of claim 8, further comprising:
forming a third sacrificial layer over the protecting layer;
removing a portion of the third sacrificial layer and a portion of the protecting layer to expose the plurality of bond pads; and
bonding the plurality of bond pads and the plurality of semiconductive pad to bond the first substrate to the second substrate.

12. The method of claim 11, further comprising:
removing a portion of the first sacrificial layer and a portion of the second sacrificial layer to form a first cavity; and
removing a portion of the second substrate, a portion of the protecting layer and a portion of the third sacrificial layer to form a second cavity.

13. The method of claim 12, wherein the membrane comprising a plurality of corrugations and a plurality of holes aligned with the first cavity.

14. The method of claim 13, wherein the plurality of corrugations are formed over the plurality of recesses of the first sacrificial layer.

15. The method of claim 12, wherein the plate comprises a plurality of apertures passing through the plate and aligned with the first cavity.

16. A method of manufacturing a semiconductor structure, comprising:
providing a substrate;
forming an oxide layer over the substrate;
disposing a plate over the oxide layer;
patterning the plate to form a plurality of apertures;
disposing a first sacrificial layer over the plate;
forming a plurality of recesses over a surface of the first sacrificial layer;
disposing a patterned membrane over the first sacrificial layer;
disposing a second sacrificial layer to surround the membrane and cover the first sacrificial layer; and
forming a plurality of conductive plugs passing through the first sacrificial layer and the second sacrificial layer to in contact with the plate,
wherein the plate includes a semiconductive member and a tensile member, and the semiconductive member is disposed within the tensile member.

17. The method of claim 16, wherein the patterned membrane has a plurality of corrugations and a plurality of holes.

18. The method of claim 17, wherein the holes of the membrane are offset from the apertures of the plate.

19. The method of claim 16, further comprising forming a plurality of standing off pads over the conductive plugs.

20. The method of claim 16, further comprising removing at least a portion of the substrate to expose the oxide layer.

* * * * *